United States Patent
Kanamori et al.

(10) Patent No.: US 11,719,575 B2
(45) Date of Patent: Aug. 8, 2023

(54) TRANSMISSION GUIDED-MODE RESONANT GRATING INTEGRATED SPECTROSCOPY DEVICE AND METHOD FOR MANUFACTURING SAME

(71) Applicant: TOHOKU UNIVERSITY, Sendai (JP)

(72) Inventors: Yoshiaki Kanamori, Miyagi (JP); Kazuhiro Hane, Miyagi (JP); Daisuke Ema, Miyagi (JP)

(73) Assignee: TOHOKU UNIVERSITY, Miyagi (JP)

( * ) Notice: Subject to any disclaimer, the term of this patent is extended or adjusted under 35 U.S.C. 154(b) by 590 days.

(21) Appl. No.: 16/641,300

(22) PCT Filed: Aug. 16, 2018

(86) PCT No.: PCT/JP2018/030396
§ 371 (c)(1),
(2) Date: Feb. 24, 2020

(87) PCT Pub. No.: WO2019/039371
PCT Pub. Date: Feb. 28, 2019

(65) Prior Publication Data
US 2020/0386619 A1    Dec. 10, 2020

(30) Foreign Application Priority Data
Aug. 24, 2017 (JP) .................. 2017-161661

(51) Int. Cl.
*G01J 3/18* (2006.01)
*G01J 3/51* (2006.01)
(Continued)

(52) U.S. Cl.
CPC . *G01J 3/18* (2013.01); *G01J 3/51* (2013.01); *G02B 6/12004* (2013.01);
(Continued)

(58) Field of Classification Search
CPC ........ G01J 3/18; G01J 3/51; G01J 2003/2806; G01J 3/0259; G01J 3/1895;
(Continued)

(56) References Cited

U.S. PATENT DOCUMENTS

2007/0165214 A1 * 7/2007 Wu ........................... G01J 3/02
356/301
2009/0008735 A1   1/2009 Ogino et al.
(Continued)

FOREIGN PATENT DOCUMENTS

CN    103245996 A      8/2013
CN    106941779 A *    7/2017    ............... G01J 1/06
(Continued)

OTHER PUBLICATIONS

Chunlei Tan et al., "Hybrid waveguide-surface plasmon polariton modes in a guided-mode resonance grating", Optics Communications, Jul. 20, 2012, pp. 4381-4386, vol. 285.
(Continued)

*Primary Examiner* — Abdullahi Nur
(74) *Attorney, Agent, or Firm* — Sughrue Mion, PLLC

(57) ABSTRACT

The present invention provides a transmission guided-mode resonant grating integrated spectroscopy device (transmission GMRG integrated spectroscopy device) characterized by comprising, disposed in this order on an optical detector array in which a plurality of diodes are mounted on a substrate made of a semiconductor: a transparent spacer layer; a waveguide layer; a transparent buffer layer provided as desired; a transmission metallic grating layer having a thickness causing surface plasmon; and a transparent protection film layer which is provided as desired.

15 Claims, 18 Drawing Sheets

(51) Int. Cl.
| | |
|---|---|
| *G02B 6/12* | (2006.01) |
| *G02B 6/122* | (2006.01) |
| *G02B 6/124* | (2006.01) |
| *G02B 6/13* | (2006.01) |
| *H01L 27/144* | (2006.01) |
| *H01L 31/0216* | (2014.01) |
| *H01L 31/0232* | (2014.01) |
| *H01L 31/18* | (2006.01) |

(52) U.S. Cl.
CPC ........... *G02B 6/124* (2013.01); *G02B 6/1226* (2013.01); *G02B 6/13* (2013.01); *H01L 27/1446* (2013.01); *H01L 31/02162* (2013.01); *H01L 31/02327* (2013.01); *H01L 31/18* (2013.01); *G02B 2006/12107* (2013.01); *G02B 2006/12123* (2013.01); *G02B 2006/12138* (2013.01)

(58) Field of Classification Search
CPC .. G02B 6/12004; G02B 6/1226; G02B 6/124; G02B 6/13; G02B 2006/12107; G02B 2006/12123; G02B 2006/12138; G02B 5/28; B82Y 20/00; G01N 21/645
See application file for complete search history.

(56) References Cited

U.S. PATENT DOCUMENTS

| | | | |
|---|---|---|---|
| 2010/0014073 A1* | 1/2010 | Hashiguchi | G01N 21/41 356/128 |
| 2016/0284923 A1 | 9/2016 | Johnson et al. | |
| 2017/0031104 A1* | 2/2017 | Chao | H01S 5/12 |
| 2017/0108375 A1* | 4/2017 | Brueck | G02B 6/124 |
| 2017/0195532 A1 | 7/2017 | Kuo et al. | |

FOREIGN PATENT DOCUMENTS

| | | |
|---|---|---|
| JP | 2009-025558 A | 2/2009 |
| JP | 2009-038352 A | 2/2009 |
| JP | 2010-225944 A | 10/2010 |
| JP | 2012-163395 A | 8/2012 |
| JP | 2017-503203 A | 1/2017 |
| JP | 2017-103445 A | 6/2017 |
| JP | 2017-123451 A | 7/2017 |
| WO | 2017/033184 A1 | 3/2017 |

OTHER PUBLICATIONS

T.W. Ebbesen et al., "Extraordinary optical transmission through sub-wavelength hole arrays", Nature, Feb. 12, 1998, pp. 667-669, vol. 391.
Tae Jin Kim et al., "Control of optical transmission through metals perforated with subwavelength hole arrays", Optics Letters, Feb. 15, 1999, pp. 256-258, vol. 24, No. 4.
S. Tibuleac et al., "Reflection and transmission guided-mode resonance filters", J. Opt. Soc. Am. A, Jul. 1997, pp. 1617-1626, vol. 14, No. 7.
International Search Report for PCT/JP2018/030396, dated Nov. 13, 2018.
Communication dated Jun. 28, 2022, issued in Japanese Application No. 2019-537584.
Office Action dated Nov. 22, 2022 issued by the Japanese Patent Office in Japanese Application Machine No. 2019-537584.
Office Action dated Dec. 9, 2022, in Taiwanese Application No. 107129397.
Daniel B. Mazulquim, et al., "Efficient band-pass color filters enabled by resonant modes and plasmons near the Rayleigh anomaly", Optics Express, Dec. 2014, vol. 22, No. 25 (9 pages).
Taiwanese Office Action dated Apr. 17, 2023 in Taiwanese Application No. 107129397.

* cited by examiner

{FIG. 1}
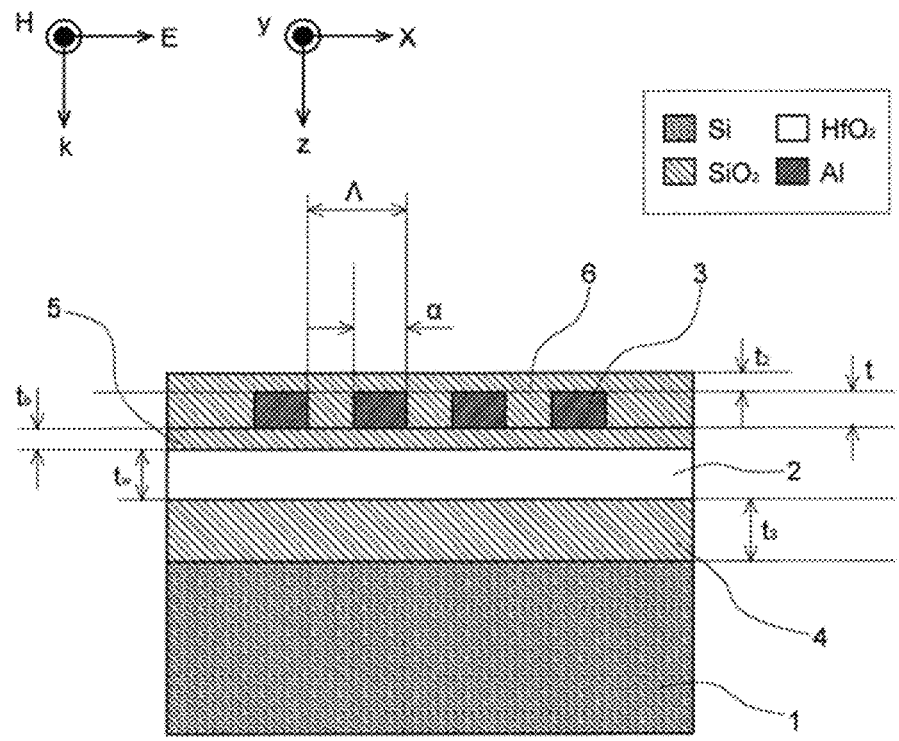
{FIG. 2}
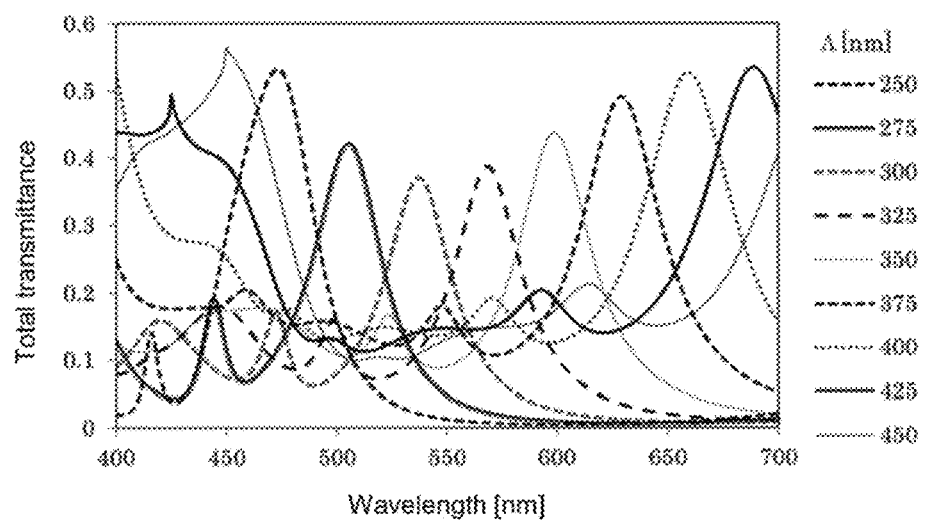

{FIG. 3}
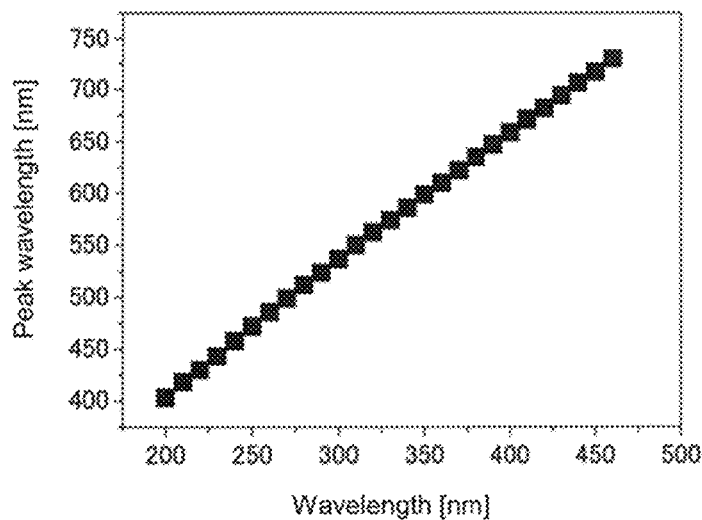
{FIG. 4}
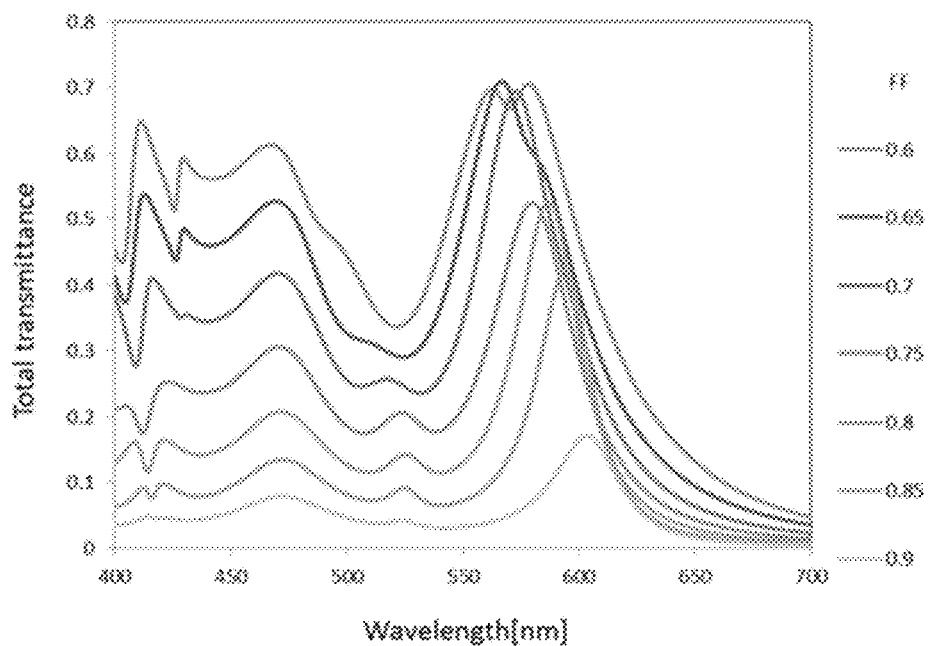

{FIG. 5}
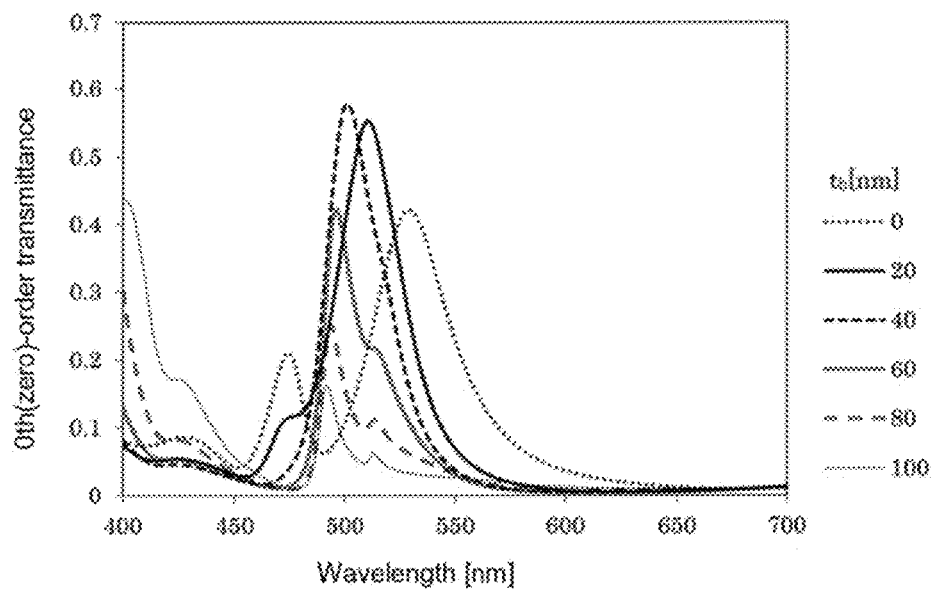
{FIG. 6}
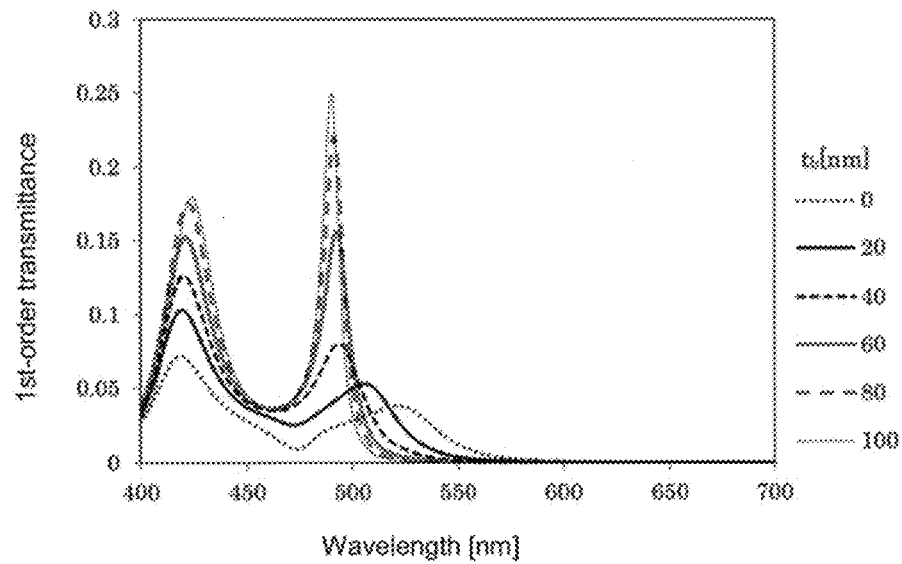

{FIG. 7}
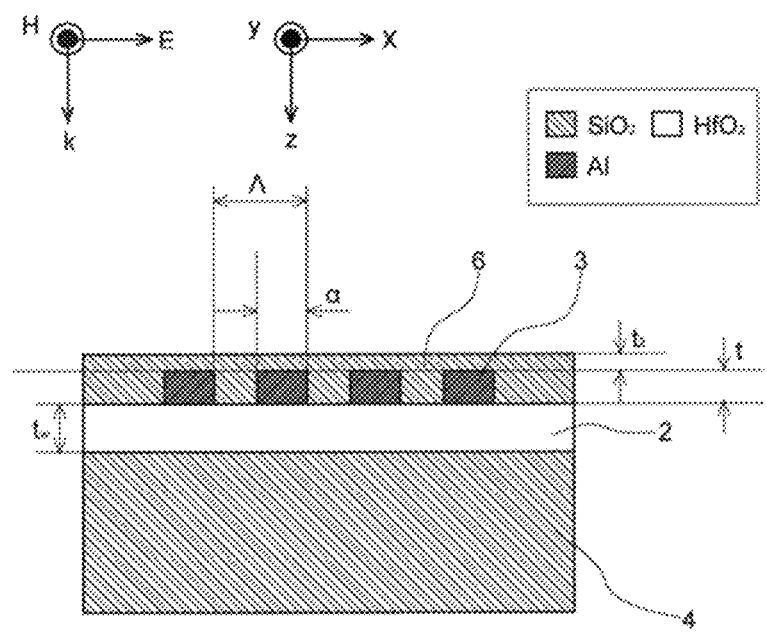
{FIG. 8}
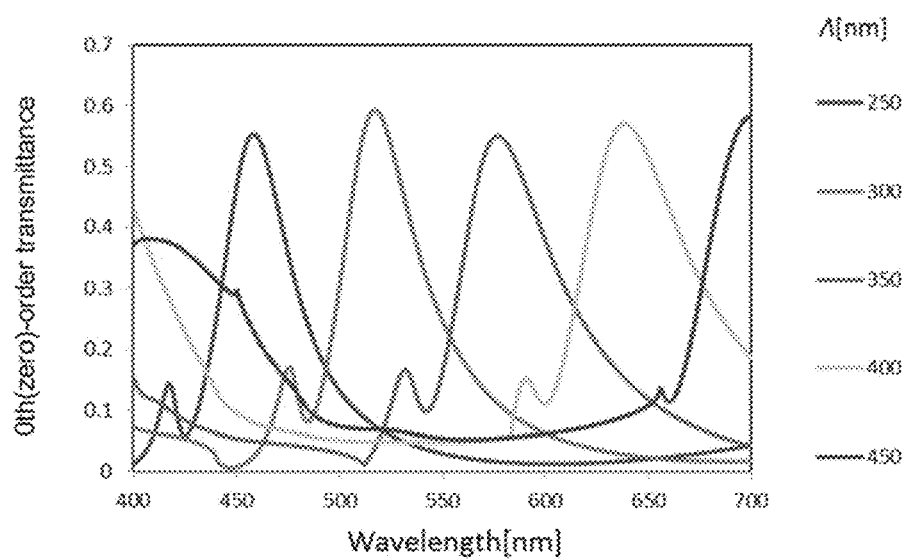

{FIG. 9}
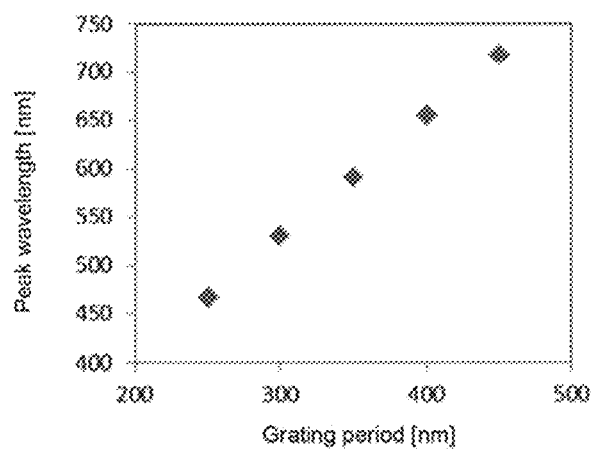
{FIG. 10}
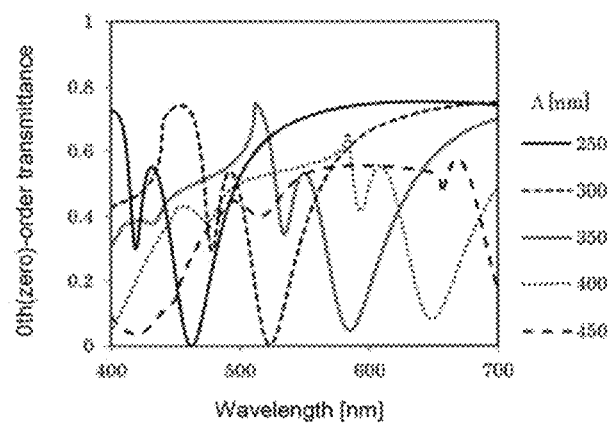
{FIG. 11}
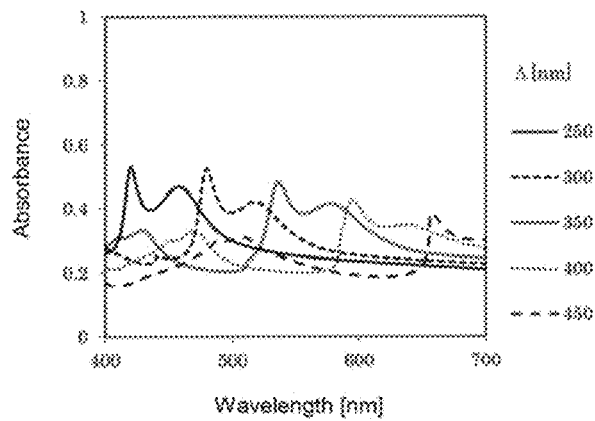

☒ SiO₂  ☐ HfO₂  ■ Al  ☒ EB Resist (gL2000-M)
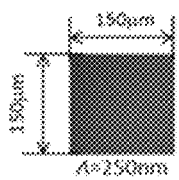 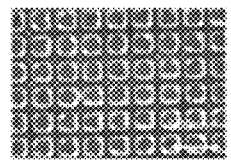 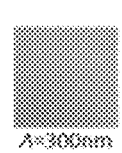 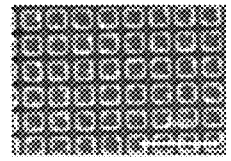
FIG. 13A — Λ=250nm, Λ=300nm — FIG. 13B
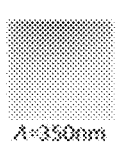 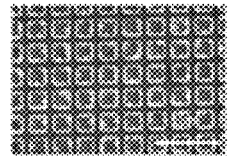 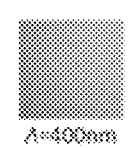 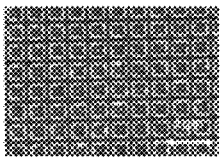
FIG. 13C — Λ=350nm, Λ=400nm — FIG. 13D
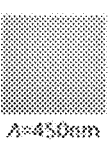 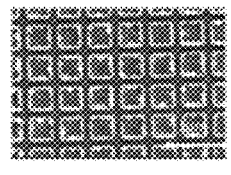
FIG. 13E — Λ=450nm {FIG. 14}
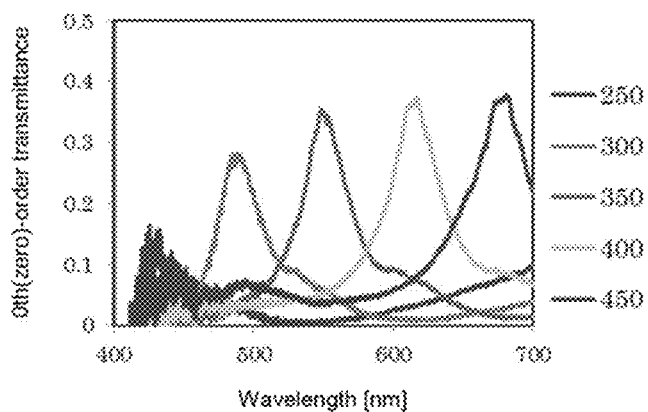
{FIG. 15}
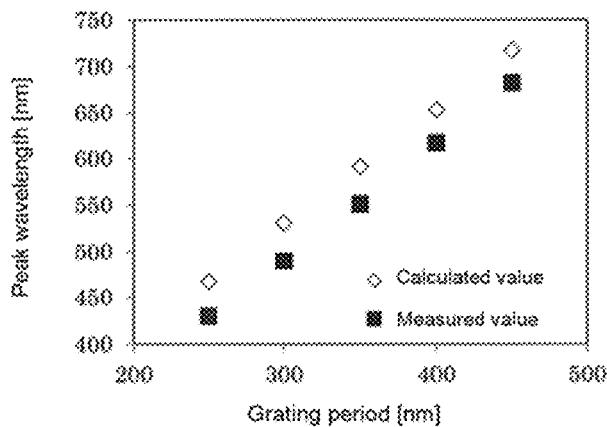
{FIG. 16}
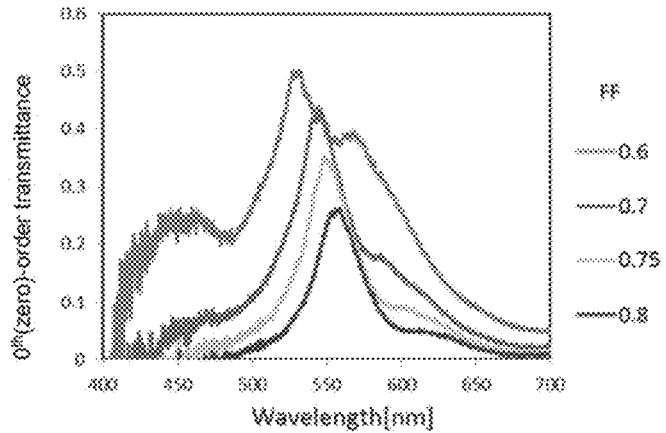

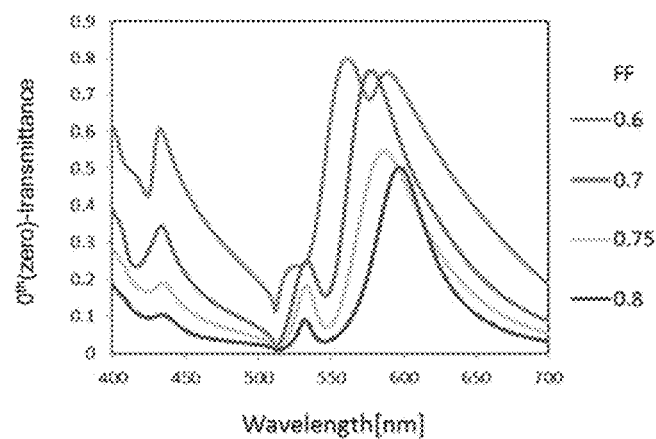
{FIG. 17}

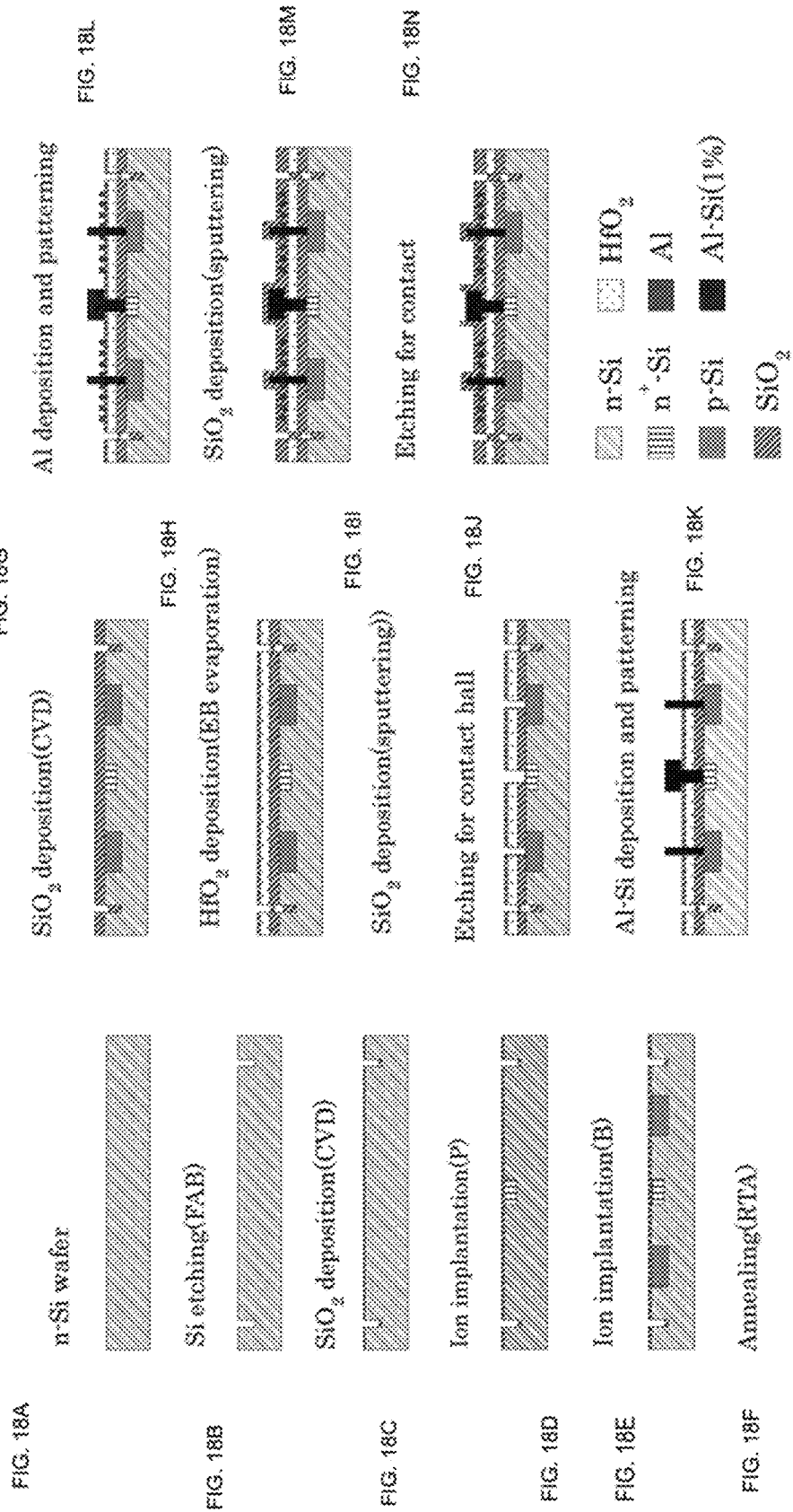

{FIG. 19}
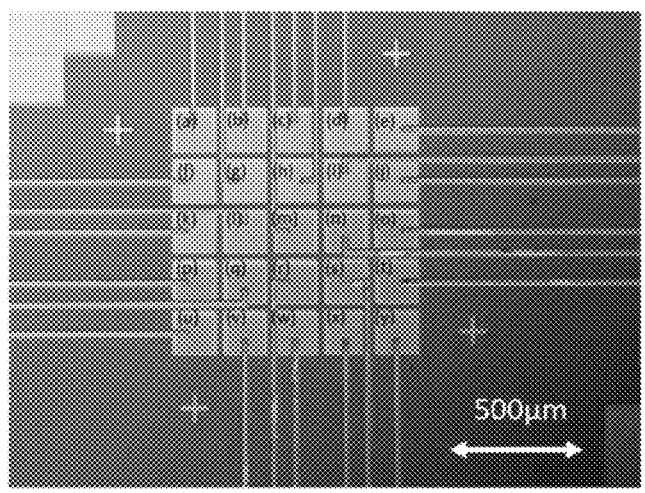
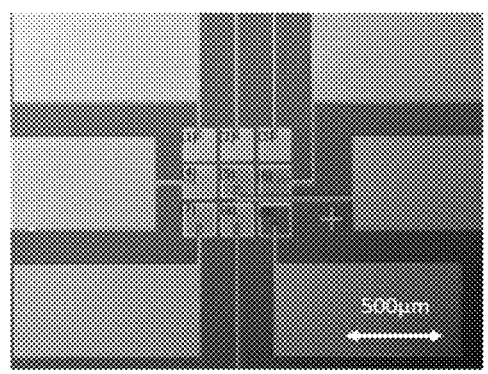
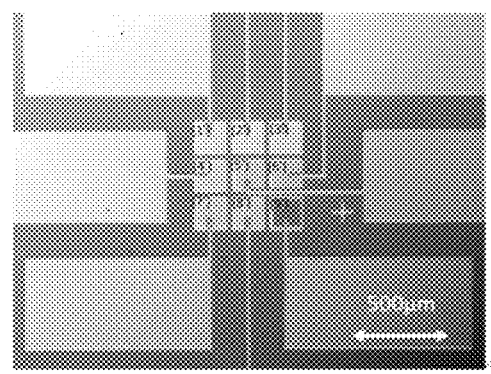
FIG. 20A　　　　　　　　　　　　FIG. 20B

FIG. 22 (1) 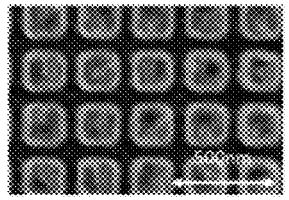
FIG. 22 (2) 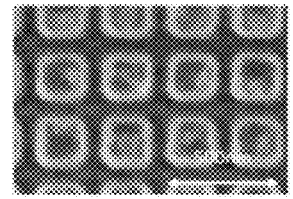
FIG. 22 (3) 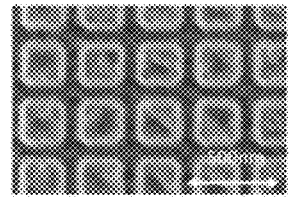
FIG. 22 (4) 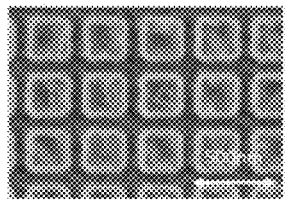
FIG. 22 (5) 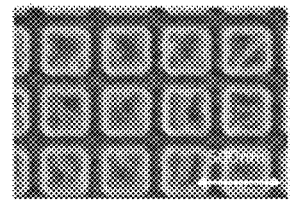
FIG. 22 (6) 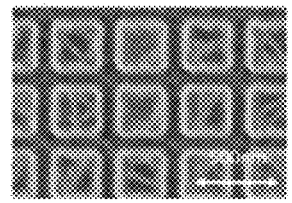
FIG. 22 (7) 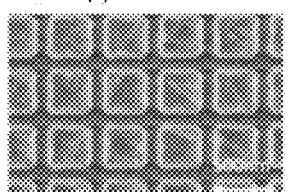
FIG. 22 (8) 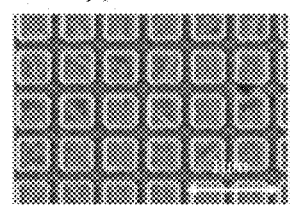
FIG. 23 (1') 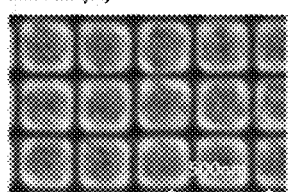
FIG. 23 (2') 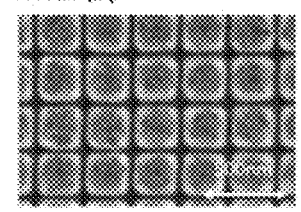
FIG. 23 (3') 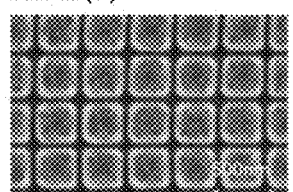
FIG. 23 (4') 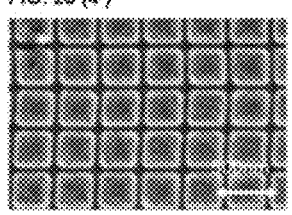
FIG. 23 (5') 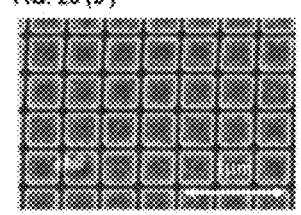
FIG. 23 (6') 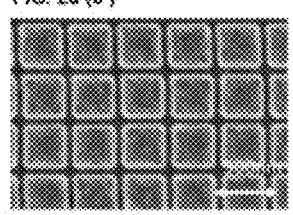
FIG. 23 (7') 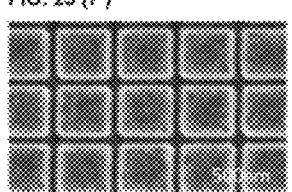
FIG. 23 (8') 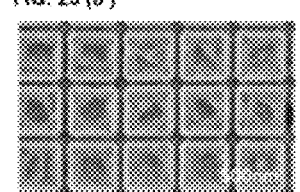

{FIG. 24}
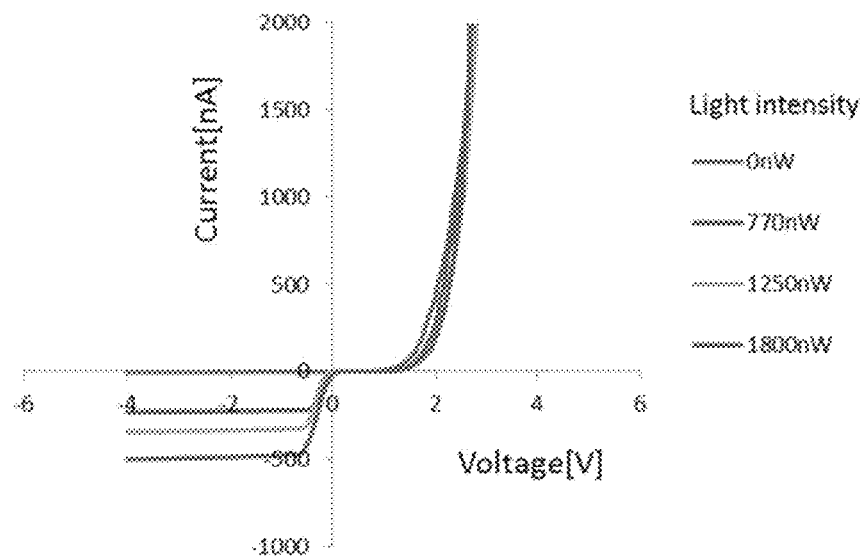
{FIG. 25}
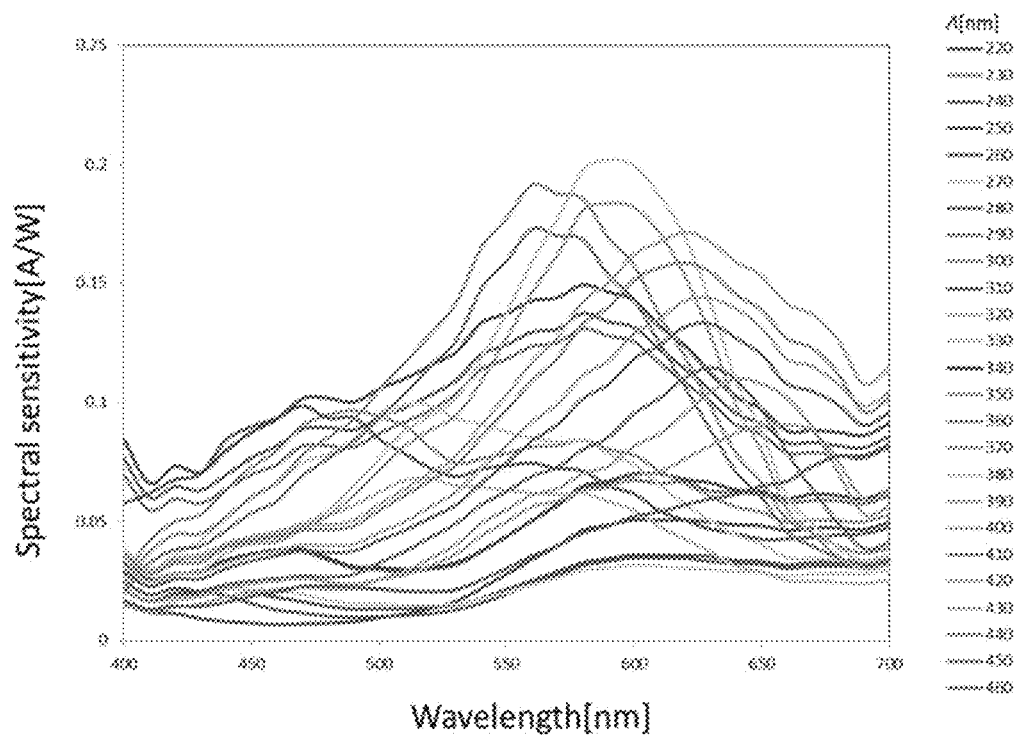

{FIG. 26}
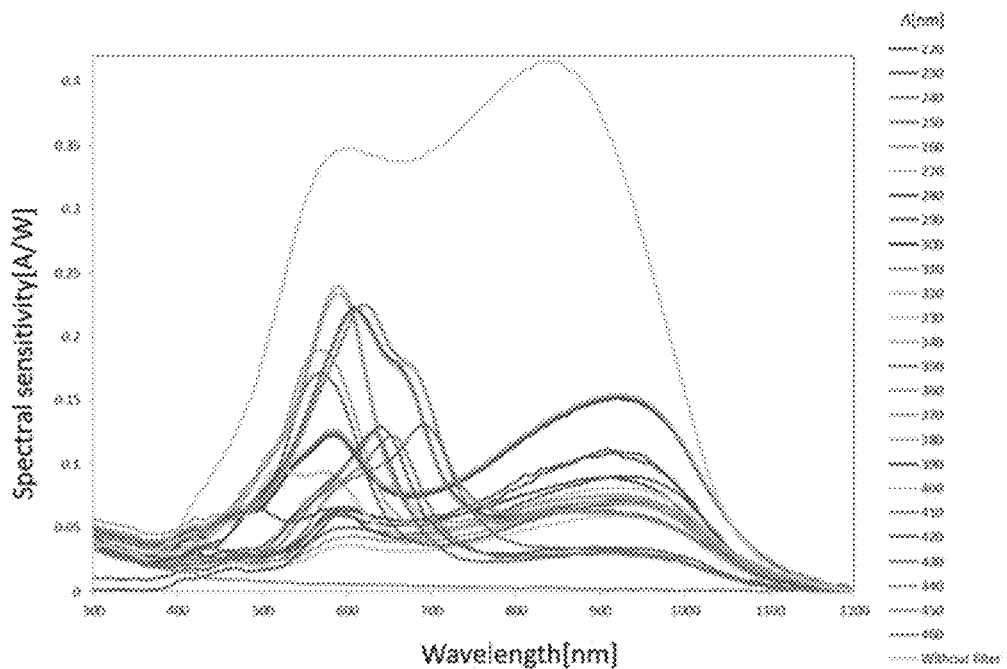
{FIG. 27}
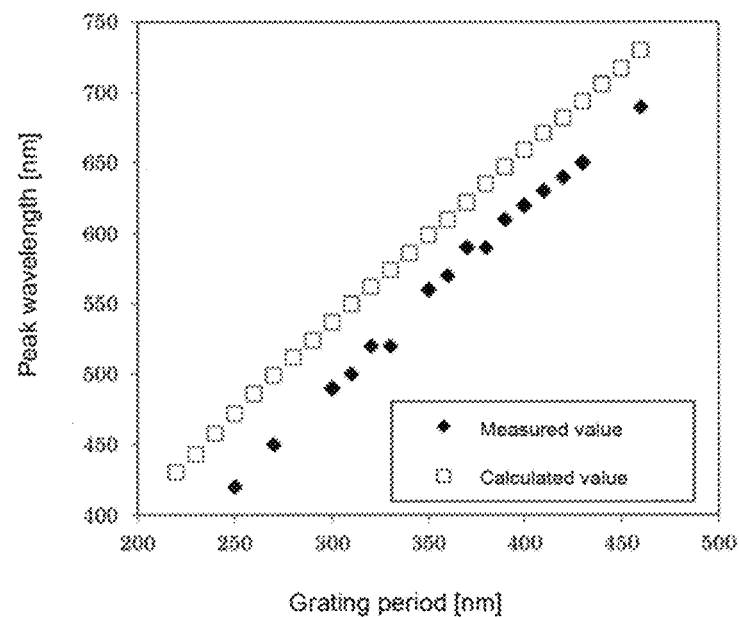

{FIG. 28}
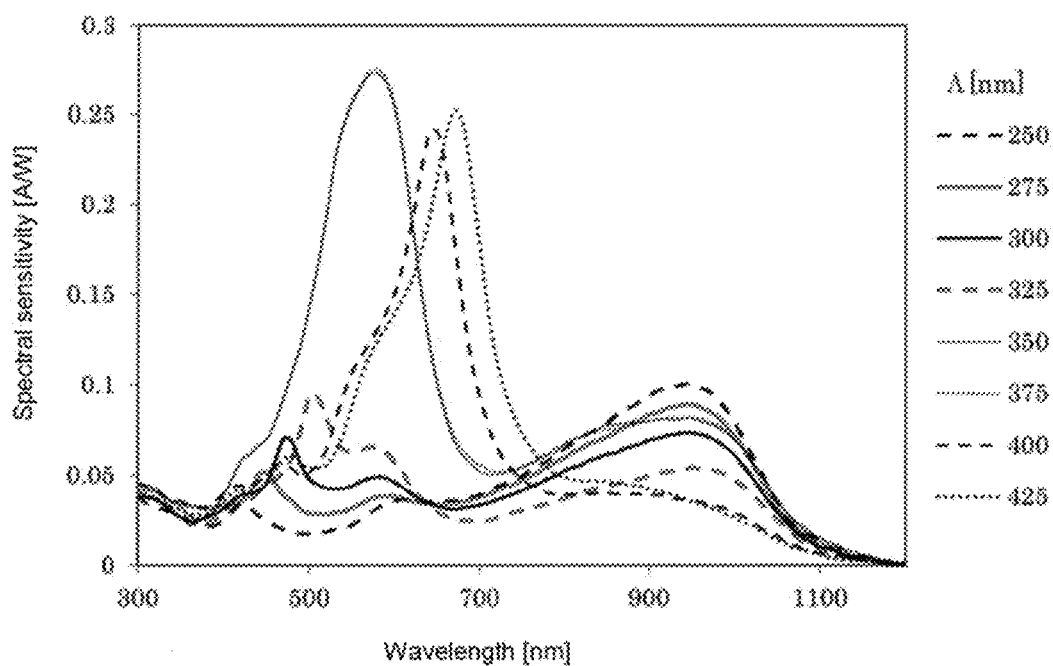
{FIG. 29}
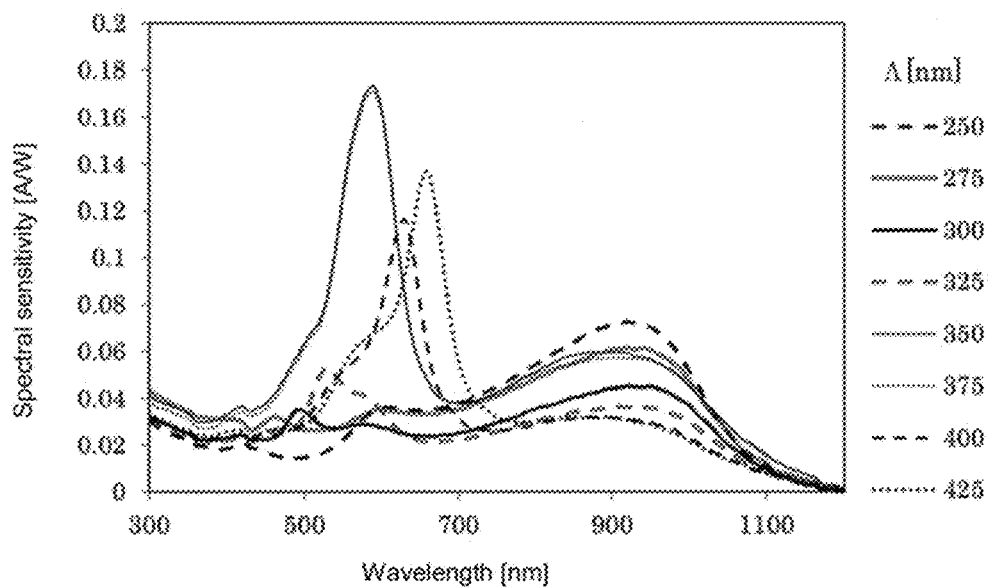

{FIG. 30}
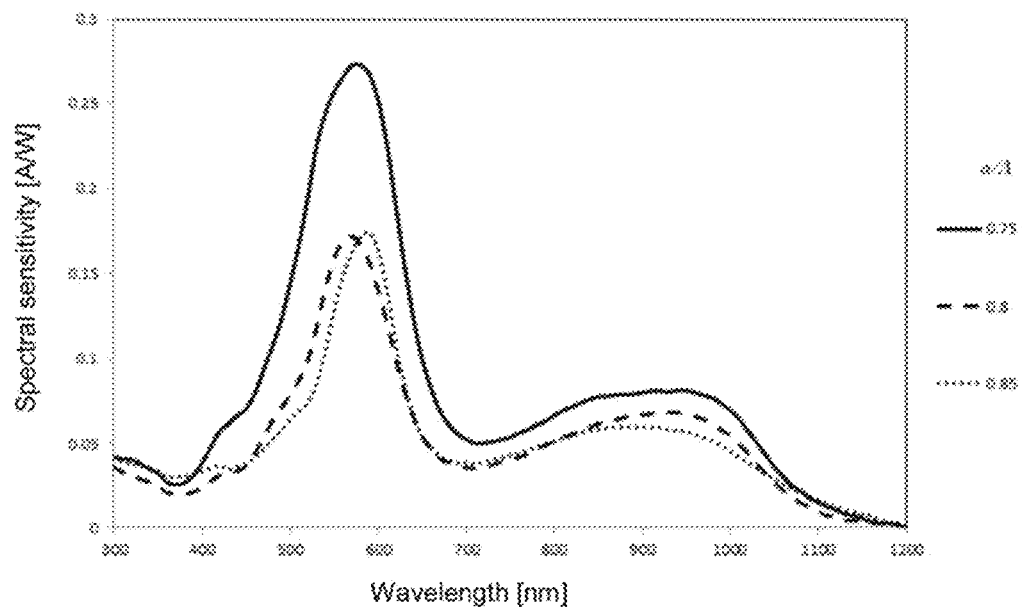
{FIG. 31}
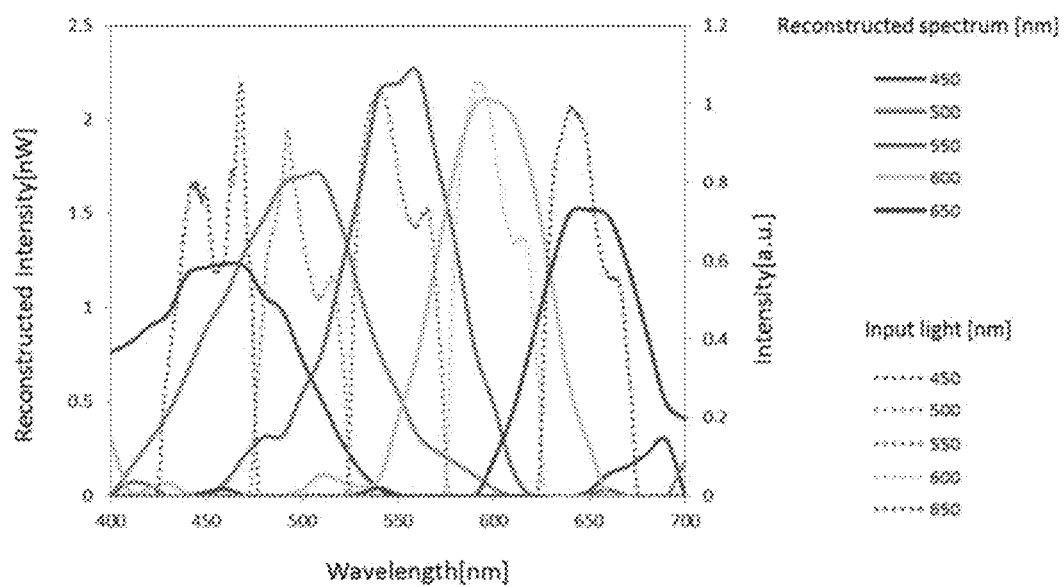

{FIG. 32}
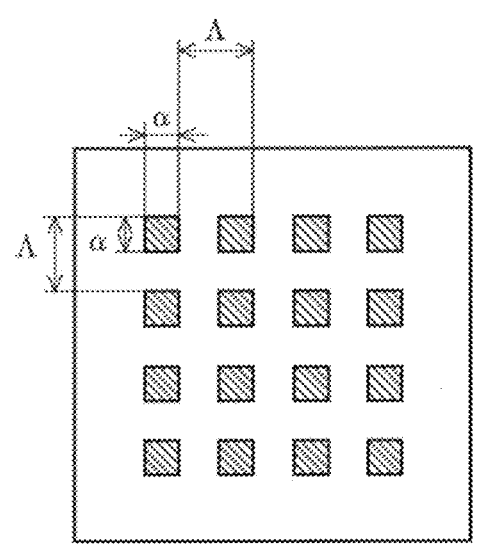

TRANSMISSION GUIDED-MODE RESONANT GRATING INTEGRATED SPECTROSCOPY DEVICE AND METHOD FOR MANUFACTURING SAME

CROSS REFERENCE TO RELATED APPLICATIONS

This application is a National Stage of International Application No. PCT/JP2018/030396 filed Aug. 16, 2018, claiming priority based on Japanese Patent Application No. 2017-161661 filed Aug. 24, 2017.

TECHNICAL FIELD

The present invention relates to a spectroscopic device used for, for example, optical measurement/analysis and optical information processing/display, and to a method for producing (manufacturing) the device. More particularly, the present invention relates to a transmission guided-mode resonant grating integrated spectroscopic device (transmission GMRG integrated spectroscopic device) in which plasmon resonance on the surface of a metal thin film is utilized, and to a method for producing the device.

BACKGROUND ART

Conventional spectroscopes generally use diffraction gratings. Since such a spectroscope requires a space for spectroscopy, a limitation is imposed on the miniaturization (downsizing) of the spectroscope. The conventional spectroscope is also costly, since it requires fine adjustment of an optical axis that must be performed manually.

In recent years, plasmonic color filters using metal nanostructures have been actively studied since Ebbesen et al. discovered the abnormal transmission phenomenon due to surface plasmons (Non-Patent Documents 1 and 2).

Plasmonic color filters have various advantages not found in conventional filters using dye absorption; for example, a variety of filters having different structures can be produced, and the filter thickness can be reduced to the order of tens of nanometers. In recent years, there has been proposed a nanoimprinting technique that involves formation of a nanostructure on a mold, and application of the mold onto a resin on a wafer, to thereby form a pattern on the wafer. This technique is expected to improve productivity.

Meanwhile, a guided-mode resonant grating (GMRG) (Non-Patent Document) has received attention as a new optical element. A GMRG is a wavelength selection filter of a subwavelength grating, and theoretically has a reflectance of 100% in a narrow band. In a subwavelength grating, the diffraction grating period is shortened to the light wavelength or less, the order of diffraction waves is reduced, and only 0th(zero)-order transmitted waves and reflected waves are generated. The reflectance and transmittance of a GMRG can be varied through control of, for example, the grating period or the grating width. Application of a GMRG to a wavelength selection filter for optical communication has been reported. A wavelength selection element based on a GMRG exhibits wavelength selectivity comparable to that of a conventional thin-film laminated wavelength selection element, despite having a smaller number of layers than the conventional wavelength selection element. Thus, the GMRG-based wavelength selection element can achieve an advanced optical design by increasing the number of layers. Since the optical characteristics are determined by the grating period and the grating width, even when the gratings have the same height, a plurality of wavelength selection elements having various wavelength selection characteristics can be produced collectively on a single substrate depending on the patterning of the gratings.

PRIOR ART DOCUMENTS

Non-Patent Documents

Non-Patent Document 1: "Extraordinary optical transmission through sub-wavelength hole arrays", Nature, Vol. 391, (1998) 667-669, Non-Patent Document 2: "Control of optical transmission through metals perforated with subwavelength hole arrays", Opt. Lett., 24, (1999) 256-258

Non-Patent Document 3: "Reflection and transmission guided-mode resonance filters", J. Opt. Soc. Am. A, Vol. 14, (1997) 1617-1626

SUMMARY OF THE INVENTION

Problem to be Solved by the Invention

An object of the present invention is to provide a transmission guided-mode resonant grating (transmission GMRG) integrated spectroscopic device in which plasmonics is utilized, and a method for producing the device.

Means for Solving the Problem

The present inventors have designed, through use of computational software, a transmission guided-mode resonant grating integrated spectroscopic device utilizing plasmonics, and have evaluated the characteristics of the produced device. The inventors have found, from the results of the evaluation, that use of the device is expected in a variety of applications. The present invention has been accomplished on the basis of this finding.

Accordingly, the present invention provides a transmission guided-mode resonant grating integrated spectroscopic device (GMRG integrated spectroscopic device) and a production method for the device, as described below.

[1] A transmission guided-mode resonant grating integrated spectroscopic device (transmission GMRG integrated spectroscopic device) characterized by comprising a photodetector array including a semiconductor substrate and a plurality of diodes disposed on the substrate; and a transparent spacer layer, a waveguide layer, an optionally provided transparent buffer layer, a transmission metal grating layer having a thickness required for generation of surface plasmons, and an optionally provided transparent protective layer, the said layers being disposed in this order on the photodetector array.

[2] The transmission GMRG integrated spectroscopic device according to [1] above, wherein the waveguide layer has a refractive index higher than that of each of the transparent spacer layer and the transparent buffer layer, which sandwich the waveguide layer.

[3] The transmission GMRG integrated spectroscopic device according to [1] or [2] above, wherein the material of the waveguide layer is selected from among hafnium oxide ($HfO_2$), aluminum oxide ($Al_2O_3$), magnesium oxide (MgO), zirconium oxide ($ZrO_2$), tantalum oxide ($Ta_2O_5$), titanium oxide ($TiO_2$), silicon nitride ($Si_3N_4$ and SiN), silicon oxynitride (SiON), silicon carbide (SiC), gallium nitride (GaN), and a polymer having a high refractive index.

[4] The transmission GMRG integrated spectroscopic device according to any of [1] to [3] above, wherein the material of the substrate is selected from among silicon (Si), Ge, InGaAs, GaN, GaAs, AlGaAs, GaAsP, GaP, CIS (a compound semiconductor composed of copper, indium, and selenium), and CIGS (a compound semiconductor composed of copper, indium, gallium, and selenium).

[5] The transmission GMRG integrated spectroscopic device according to any of [1] to [4] above, wherein the substrate is a silicon substrate, the transparent spacer layer is an $SiO_2$ layer, the waveguide layer is a hafnium oxide ($HfO_2$) layer, and the transparent buffer layer is an $SiO_2$ layer.

[6] The transmission GMRG integrated spectroscopic device according to any of [1] to [5] above, wherein the metal of the transmission metal grating layer is selected from among gold, silver, aluminum, and copper.

[7] The transmission GMRG integrated spectroscopic device according to any of [1] to [6] above, wherein the metal of the transmission metal grating layer is aluminum (Al), the transmission metal grating layer has a grating structural period $\Lambda$ of 100 to 560 nm and a fill factor (FF) of 0.4 to 0.95 where FF is the ratio of the length $\alpha$ of one side of each Al dot to $\Lambda$.

[8] The transmission GMRG integrated spectroscopic device according to any of [1] to [7] above, wherein the transparent buffer layer is an SiO2 layer and has a thickness ($t_b$) of 0 to 300 nm.

[9] A product comprising a transmission guided-mode resonant grating integrated spectroscopic device (transmission GMRG integrated spectroscopic device) as recited in any of [1] to [8] above.

[10] A method for producing a transmission guided-mode resonant grating integrated spectroscopic device (transmission GMRG integrated spectroscopic device) as recited in any of [1] to [8] above, the method being characterized by comprising forming the photodetector array; and stacking, on the substrate, the transparent spacer layer, the waveguide layer, the optional transparent buffer layer, the transmission metal grating layer, and the optional transparent protective layer in this order.

[11] A method for producing a transmission guided-mode resonant grating integrated spectroscopic device (transmission GMRG integrated spectroscopic device) as recited in any of [1] to [8] above, the method being characterized by comprising forming the photodetector array; forming a transmission guided-mode resonant grating structure by stacking the waveguide layer, the optional transparent buffer layer, the transmission metal grating layer, and the optional transparent protective layer in this order on a transparent substrate serving as the transparent spacer layer; and bonding the photodetector array to the transparent spacer layer of the transmission guided-mode resonant grating structure.

[12] A method for producing a transmission GMRG integrated spectroscopic device according to [10] or [11] above, wherein the method comprises a step of forming a grating pattern of the transmission metal grating layer (GMRG) or a mask therefor by means of nanoimprinting lithography, stepper lithography, or electron beam lithography.

[13] A transmission guided-mode resonant grating structure (transmission GMRG structure) characterized by comprising a transparent substrate, a waveguide layer, an optionally provided transparent buffer layer, a transmission metal grating layer having a thickness required for generation of surface plasmons, and an optionally provided transparent protective film in this order.

Effects of the Invention

The present invention can achieve a spectroscope head (having a size such that it can be placed on a fingertip), which is incomparably smaller than a conventional spectroscope, and can achieve a spectroscope that can be built into a smartphone. The spectroscope of the present invention can achieve more colors than a conventional color filter and has a thickness which is about one tenth smaller than the thickness of the conventional color filter. The present invention enables color filters to be disposed at higher density.

The spectroscope of the present invention is considerably smaller in size than a conventional one, and can be mass-produced at low cost by means of a semiconductor microfabrication technique. Thus, the spectroscope can be built into, for example, a smartphone, a wearable device, and a robot, and enables easy spectroscopic analysis of various targets. The spectroscope can be expected to be applied in a variety of fields, for example, non-invasive health monitoring by vascular measurement, skin care or cosmetic analysis by skin measurement, food freshness checking, water quality management, drug analysis, diabetes testing, color analysis or management of color printed products and clothes, color analysis or management of displays or LEDs, food safety and quality testing, and analysis of, for example, aerosol and gas.

BRIEF DESCRIPTION OF THE DRAWINGS

FIG. 1 is a schematic cross-sectional view showing an example of the structure of the GMRG integrated spectroscopic device of the present invention.

FIG. 2 shows calculated values of the ratio of the total amount of light transmitted to an Si photodiode (FF=0.8, t=30 nm, $t_2$=50 nm, $t_3$=150 nm, $t_b$=0 nm).

FIG. 3 shows the positions of transmission peaks corresponding to structural periods (FF=0.8, t=30 nm, $t_2$=50 nm, $t_3$=150 nm, $t_b$=0 nm).

FIG. 4 shows a change in the total amount of light transmitted to an Si photodiode with respect to FF ($\Lambda$=350 nm, t=30 nm, $t_2$=50 nm, $t_3$=150 nm, $t_b$=0 nm).

FIG. 5 shows the amount of 0th(zero)-order diffracted light transmitted to an Si photodiode ($\Lambda$=300 nm).

FIG. 6 shows the amount of 1st-order diffracted light transmitted to an Si photodiode ($\Lambda$=300 nm).

FIG. 7 shows a computation model of a filter on a quartz substrate.

FIG. 8 shows calculated values of the transmittance of a GMRG on a quartz substrate (0th(zero)-order light).

FIG. 9 shows the relationship between structural period (grating period) and transmission peak wavelength.

FIG. 10 shows calculated values of transmittance of GMRGs on a quartz substrate (0th(zero)-order light).

FIG. 11 shows calculated values of absorbance of GMRGs on a quartz substrate.

FIGS. 13A-13E show transmission microscope images and SEM images of GMRGs on a quartz substrate (FIG. 13A $\Lambda$=250 nm, FIG. 13B $\Lambda$=300 nm, FIG. 13C $\Lambda$=350 nm, FIG. D $\Lambda$=400 nm, FIG. 13E $\Lambda$=450 nm).

FIG. 14 shows the transmission characteristics of GMRGs.

FIG. 15 shows comparison between measured values (black square marks) and calculated values (white rhombic marks) of transmission peak wavelengths corresponding to grating periods.

FIG. 16 shows measured values of a change in the transmission characteristics of a GMRG with respect to FF (Λ=350 nm).

FIG. 17 shows calculated values of a change in the transmission characteristics of a GMRG with respect to FF (Λ=350 nm).

FIGS. 18A-18N show an example of production process for a GMRG integrated device.

FIG. 19 shows an example of photograph of a produced device (FF=0.8).

FIG. 20A is an example of microscopic image of an array portion (FF=0.75), and FIG. 20B is an example of microscopic image of an array portion (FF=0.85).

FIG. 21A Λ=220 nm, FIG. 21B 230 nm, FIG. 21C 240 nm, FIG. 21D 250 nm, FIG. 21E 260 nm, FIG. 21F 270 nm, FIG. 21G 280 nm, FIG. 21H 290 nm, FIG. 21I 300 nm, FIG. 21J 310 nm, FIG. 21K 320 nm, FIG. 21L 330 nm, FIG. 21M 340 nm, FIG. 21N 350 nm, FIG. 21O 360 nm, FIG. 21P 370 nm, FIG. 21Q 380 nm, FIG. 21R 390 nm, FIG. 21S 400 nm, FIG. 21T 410 nm, FIG. 21U 420 nm, FIG. 21V 430 nm, FIG. 21W 440 nm, FIG. 21X 450 nm, FIG. 21Y 460 nm.

FIGS. 22(1)-22(8) shows examples of photographs of produced devices (FF=0.75): FIG. 22(1) Λ=250 nm, FIG. 22(2) 275 nm, FIG. 22(3) 300 nm, FIG. 22(4) 325 nm, FIG. 22(5) 350 nm, FIG. 22(6) 375 nm, FIG. 22(7) 400 nm, FIG. 22(8) 425 nm.

FIGS. 23(1')-23(8') show photographs of produced devices (FF=0.85): FIG. 23(1') Δ=250 nm, FIG. 23(2') 275 nm, FIG. 23(3') 300 nm, FIG. 23(4') 325 nm, FIG. 23(5') 350 nm, FIG. 23(6') 375 nm, FIG. 23(7') 400 nm, FIG. 23(8') 425 nm.

FIG. 24 shows examples of the I-V characteristics of a produced photodiode (the photodiode (p) shown in FIG. 19).

FIG. 25 shows an example of the wavelength sensitivity characteristics of a produced device (wavelength range: 400 to 700 nm).

FIG. 26 shows an example of the wavelength sensitivity characteristics of a produced device (wavelength range: 300 to 1,200 nm).

FIG. 27 shows comparison between measured values (black rhombic marks) and calculated values (white square marks) of wavelength sensitivity characteristics (peak wavelength versus grating period).

FIG. 28 shows the wavelength sensitivity characteristics of a produced device (FF=0.75).

FIG. 29 shows an example of the wavelength sensitivity characteristics of a produced device (FF=0.85).

FIG. 30 is a graph showing comparison between wavelength sensitivity characteristics at FF=0.75, 0.8, and 0.85 (Λ=350 nm).

FIG. 31 shows comparison between incident light spectral characteristics reconstituted by the device of the present invention (solid lines) and incident light spectral characteristics measured by a commercially available spectroscope (dotted lines).

FIG. 32 is an example of top view of a transmission metal grating layer.

FIGS. 33A and 33B show the concept of a spectroscopic device, indicating the relationship between a color filter array and a photodetector array, wherein FIG. 33A is a perspective view, and FIG. 33B is a side sectional view.

MODES FOR CARRYING OUT THE INVENTION

Figure 12A:
FIGS. 12A-12F show an example of production process for a GMRG on a quartz substrate.

Embodiments of the present invention will next be described with reference to accompanying drawings. The present invention should not be construed as being limited to the following embodiments, which fall within the scope of appended claims.

The present invention is directed to a transmission guided-mode resonant grating integrated spectroscopic device (transmission GMRG integrated spectroscopic device) including a photodetector array including a semiconductor substrate and a plurality of diodes disposed on the substrate; and a transparent spacer layer, a waveguide layer, an optionally provided transparent buffer layer, a transmission metal grating layer having a thickness required for generation of surface plasmons, and an optionally provided transparent protective layer, the layers being disposed in this order on the photodetector array. The aforementioned phrase "a plurality of diodes" refers to the case where the number of disposed diodes is preferably 2 or more, more preferably 2 to about 1,000 or 2 to about 500.

[Optical Design of GMRG Integrated Device]
(1) Design of Structural Period

FIG. 1 is a schematic cross-sectional view of a structure according to an embodiment of the present invention. In FIG. 1, reference numeral 1 denotes a photodetector array (silicon wafer); reference numeral 2 denotes an HfO$_2$ waveguide layer having a thickness $t_w$; reference numeral 3 denotes a photofilter layer which has a structural period Λ and a thickness t and in which each side of each Al dot has a length α; reference numeral 4 denotes an SiO$_2$ spacer layer having a thickness $t_3$; reference numeral 5 denotes an optionally provided buffer layer (thickness $t_b$); and reference numeral 6 denotes a transparent protective film (SiO$_2$ protective film) having a thickness $t_2$. Since the metal grating layer is covered with the transparent protective film, optical characteristics are not affected by stacking of another optical filter, and damage to the layer (e.g., caused by contact) is prevented.

The thickness $t_w$ of the HfO$_2$ waveguide layer is generally adjusted to 10 to 500 nm, preferably 20 to 250 nm, more preferably 50 to 150 nm. A thickness $t_w$ of the waveguide layer of more than 500 nm may cause a high-order propagation mode and multi-peak spectra, leading to impaired optical characteristics. In addition, a thickness $t_w$ of more than 500 nm is not industrially preferred because of an increase in material and production costs. In the process shown in FIGS. 18A-18N, the thickness $t_w$ of the HfO$_2$ waveguide layer is adjusted to 100 nm. Meanwhile, a thickness $t_w$ of less than 10 nm may cause the absence of a basic mode of light propagating through the waveguide layer, resulting in functional deterioration of the waveguide layer.

The thickness $t_2$ of the transparent SiO2 protective film is preferably adjusted to 0 to 0.1 mm, more preferably 0 to 10 μm, still more preferably 0 to 1 μm. A thickness $t_2$ of the protective film of more than 0.1 mm causes an increase in production cost. The protective film is formed by, for example, sputtering as described in the embodiments, or any other technique, such as vapor deposition, CVD, spin coating, or covering of the metal grating layer with a separately prepared protective sheet (or protective plate). In general, the thickness $t_2$ is preferably 1 μm or less in view of cost reduction. If the protective film is formed from a polymer material through, for example, spin coating, the thickness $t_2$ is preferably 100 μm or less. In the process shown in FIGS. 18A-18N, the thickness $t_2$ is adjusted to 50 nm.

The thickness t of the transmission metal grating layer is generally adjusted to 1 to 500 nm, preferably 1 to 100 nm, more preferably 10 to 100 nm.

A thickness t of less than 1 nm may cause difficulty in forming a metal grating layer maintaining desired homogeneity, resulting in reduced surface plasmon effect. Meanwhile, a thickness t of more than 500 nm may cause an increase in material and production costs, a surface plasmon mode in a thickness direction, and multi-peak spectra, leading to impaired optical characteristics. In the embodiments, the thickness t is adjusted to 30 nm.

As shown in FIG. 1, the gap between adjacent metal grating layers 3 (thickness t) is vacant or filled with a transparent material, such as the aforementioned transparent $SiO_2$ protective film. For example, when the gap between the metal grating layers 3 (thickness t) is filled with a transparent material, the transparent material may be the same as that of the spacer layer (thickness $t_3$) or the transparent protective film (thickness $t_2$). Alternatively, the transparent material filling the gap, the material of the transparent protective film, the material of the layer having the thickness $t_3$, and the material of the layer having the thickness $t_2$ may differ from one another.

The plasmonic color filter formed on the photodetector is provided so as to cover the light-receiving region of the photodetector array. Preferably, the plasmonic color filter is formed to have a size equal to or larger than that of the light-receiving region of the photodetector. In the present invention, each color filter has a size of, for example, 150 μm square, and the photodiode has a light-receiving area of 100 μm square.

The size of each color filter is generally 5 μm square to 1 mm square, preferably 50 to 500 μm square, more preferably 50 to 200 μm square.

Each color filter may have any shape other than square, such as a rectangular, circular, or elliptical shape. The size of the color filter is designed as appropriate.

The thickness $t_3$ of the transparent $SiO_2$ layer formed on the photodetector array (silicon wafer) is generally adjusted to 50 nm or more, preferably 100 to 1,000 nm, more preferably 100 to 500 nm, still more preferably 100 to 300 nm. A thickness $t_3$ of less than 50 nm may cause leakage of light to the material forming the photodetector via an evanescent wave leaking from the waveguide layer 2, leading to impaired optical characteristics.

The transparent $SiO_2$ layer is required to have a thickness $t_3$ of 50 nm or more, in order to reduce the optical interference within the transparent $SiO_2$ layer or the surface reflection of the photodetector. In the process shown in FIGS. 18A-18N, the thickness $t_3$ is adjusted to 150 nm.

In the present structure, filter characteristics can be investigated through control of fill factor (FF=α/Λ) and the thickness of each layer. The thickness $t_3$ of the spacer is appropriately adjusted for integration with the photodiode.

The ratio of the amount of light transmitted to the Si substrate is calculated by the RCWA (rigorous coupled-wave analysis) method according to the computation model shown in FIG. 1, to thereby estimate the spectroscopic characteristics obtained from the present device. Light whose electric field extends in the x-axis direction is caused to be incident in a vertical direction, and total transmittance (including mth-order diffracted light) is calculated. The order of the Fourier series expansion for calculation was determined to be −6 to 6th-order in the x-axis direction and −6 to 6th-order in the y-axis direction. The wavelength interval was adjusted to 1 nm. Designed values were as follows: FF=0.8, t=30 nm, $t_2$=50 nm, $t_3$=150 nm, and $t_b$=0 nm. Λ was varied within a range of 250 to 450 nm. FIG. 2 shows the calculation results. As shown in FIG. 2, the obtained calculation results correspond to the principle of the transmission GMRG, which can control transmission peaks by structural periods. FIG. 3 shows a graph prepared by plotting the positions of transmission peaks against structural periods Λ of 200 to 460 nm. The graph indicates that the transmission peak shifts in proportion to the structural period.

(2) Design of Fill Factor (FF)

A change in transmission peak with FF (a/Λ) was calculated. Specifically, a change in transmission peak was calculated by varying FF from 0.6 to 0.9. Designed values were as follows: Λ=350 nm, t=30 nm, $t_2$=50 nm, $t_3$=150 nm, and $t_b$=0 nm. FIG. 4 shows the calculation results. As shown in FIG. 4, transmission peaks emerge within an FF range of 0.6 to 0.9. As shown in FIG. 4, an increase in FF leads to a decrease in transmittances at positions other than the transmission peaks, and also leads to a decrease in the transmission peaks. Thus, FF must be adjusted to an appropriate value. An FF of 0.75 to 0.85 results in the maximum ratio of the transmittance at the transmission peak to that at a position other than the transmission peak. Thus, an FF of 0.8 was used as a designed value.

The grating structure period Λ is generally adjusted to 100 to 560 nm, preferably 140 to 540 nm, more preferably 160 to 520 nm. The fill factor (FF) is generally adjusted to 0.4 to 0.95, preferably 0.6 to 0.9, more preferably 0.7 to 0.85.

(3) Design of Buffer Layer

It is known that the transmission peak of the transmission GMRG can be controlled by the thickness ($t_b$) of the buffer layer. FIGS. 5 and 6 respectively show 0th(zero)-order light transmittance and 1st-order light transmittance for different thicknesses of the buffer layer. As shown in FIG. 5, a strong 0th(zero)-order light transmission peak emerges when $t_b$ is 0 nm, and an increase in $t_b$ leads to a decrease in the width of the transmission peak. In the present invention, the thickness ($t_b$) of the buffer layer is adjusted to 0 to 300 nm, preferably 0 to 200 nm, more preferably 0 to 100 nm. For example, when $t_b$ is 0 to 100 nm, a transmission peak emerges; i.e., the transmission GMRG functions as a filter. However, when $t_b$ is 100 nm, the transmittance may be lowered to about 20%. As shown in FIG. 6, an increase in $t_b$ leads to an increase in 1st-order light transmittance. These results indicate that appropriate adjustment of the thickness of the buffer layer to 0 to 100 nm achieves a sharper transmission peak.

[Production of GMRG on Quartz Substrate]

(1) Transmission Characteristics of GMRG on Quartz Substrate

The transmission characteristics of the filter can be measured by producing the GMRG on a quartz substrate before actual production of the GMRG integrated device. Thus, the significance of design can be determined by comparison between calculated values and measured values. FIG. 7 shows a computation model. Light whose electric field extends in the x-axis direction is caused to be incident in a vertical direction, and total transmittance (including mth-order diffracted light) is calculated. The order of the Fourier series expansion for calculation was determined to be −6 to 6th-order in the x-axis direction and −6 to 6th-order in the y-axis direction. The wavelength interval was adjusted to 1 nm. Designed values were as follows: FF=0.75, t=30 nm, $t_2$=50 nm, and $t_b$=0 nm. Λ was varied within a range of 250 to 450 nm. FIG. 8 shows the calculation results. As shown in FIG. 8, the transmission peak shifts in accordance with the structural period. FIG. 9 shows the positions of transmission peaks plotted against structural periods. This indicates that the position of the transmission peak shifts in proportion to the structural period.

For reference, FIGS. 10 and 11 show the 0th(zero)-order reflectance and absorbance of the filter, respectively. About 20% absorption by Al is observed over the entire range of wavelength. The reflectance was up to about 80%; i.e., a large amount of light not contributing to transmission was found to be emitted as reflected light.

(2) Production

A GMRG is produced on a quartz substrate. FIGS. 12A-12F show a production process. Detailed conditions are described below.

FIG. 12A A quartz substrate having a thickness of 500 μm is used. The substrate is subjected to piranha washing for removal of metal and organic stains.

Figure 12D:
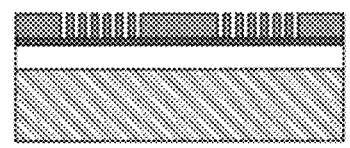
Figure 12B:
Figure 12E:
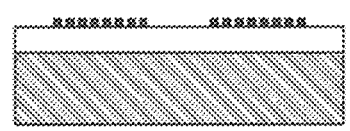
Figure 12C:
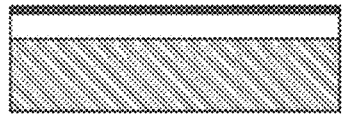

FIGS. 12B and 12C An $HfO_2$ layer (100 nm) is formed by electron-beam deposition, and an Al layer (30 nm) is formed by sputtering.

FIGS. 12D and 12E A nanodot array structure is patterned by electron beam lithography, and the Al layer is etched by fast atom beam (FAB) under the same conditions as those for formation of the Al filter.

Figure 12F:
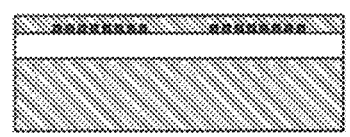

FIG. 12F An $SiO_2$ protective film having a thickness of 50 nm is formed by sputtering.

(3) Results of production (FF=0.75)

FIGS. 13A-13D show transmission microscope images and SEM images of the produced GMRG. As shown in FIGS. 13A-13D, the structure is precisely produced, and the amount of transmitted light changes in accordance with the structural period. The transmittance in a visible light region was measured by means of a spectroscope. The transmission characteristics were measured under the conditions that randomly polarized white light was caused to be incident vertically on the filter from the substrate side. A glass stage was used as a reference. The results are shown in FIG. 14. FIG. 15 shows comparison between measured values and calculated values of the positions of transmission peaks. The results of the transmission characteristics indicated that the transmission peak can be controlled by adjustment of the structural period. The difference between the measured values and the calculated values of the peak positions was 50 nm or less; i.e., the GMRG was precisely produced. However, the transmittance is lower by about 20% than the calculated value. This is probably attributed to the error in, for example, refractive index between the computation model and the actual model. The transmittance at a position other than the transmission peak was reduced as compared with the case of the transmission characteristics of the Al filter; i.e., transmission of strong 0th(zero)-order light was observed. The results indicated that the presence of the waveguide layer causes resonance transmission based on a guided-mode resonance different from that of the Al filter. Despite the incidence of randomly polarized light, the measured values were well consistent with the calculated values. This indicates high spectroscopic accuracy of the GMRG.

(4) Results of Production (Comparison Among Cases where FF=0.6, 0.7, and 0.8)

In order to examine how measured values are reflected by a change in transmission characteristics with FF, GMRGs having FF values of 0.6, 0.7, and 0.8, respectively, were produced. FIG. 16 shows comparison between their transmission characteristics. For reference, FIG. 17 shows calculated values as determined by the RCWA method. FIG. 16 shows the results as designed; i.e., an increase in FF leads to a clearer transmission peak.

[Production of GMRG Integrated Device]

(1) The filter characteristics as designed were determined through production of a GMRG on a quartz substrate. Since the results demonstrated the significance of design, a spectroscopic device was actually produced by forming a GMRG on a photodiode array.

(2) FIGS. 18A-18N show a production process for a GMRG integrated device.

FIG. 18A An n-Si substrate (wafer) is subjected to RCA cleaning and washed with hydrofluoric acid (wafer: N-214, thickness: 400±25 μm, resistivity: 1 to 5 ohmcm, crystal axis: <100>, dopant: P)

FIG. 18B The Si substrate is etched by FAB (fast atom beam) to thereby form an alignment mark.

FIG. 18C An $SiO_2$ protective film (5 nm) is formed by TEOS ($Si(OC_2H_5)_4$) CVD (chemical vapor deposition).

FIG. 18D An $n^+$region (990 μm×990 μm) is formed for electrode contact. P ion implantation is performed under the following conditions (use of an ion implantation apparatus (NH-205R available from Nissin Ion Equipment Co., Ltd.) in Micro System Integration Center, Tohoku University, ion source: P, dose: $2\times10^{15}$ ions/cm$^2$, acceleration voltage: 50 kV, implantation angle:7°).

FIG. 18E B ion implantation is performed for formation of p-Si (medium-current ion implantation apparatus (available from ULVAC), measured in Micro/Nano-Machining Research and Education Center, Tohoku University, ion source: $B^+$, dose: $2\times10^{14}$ ions/cm$^2$, acceleration voltage: 100 kV, implantation angle:7°).

FIG. 18F Annealing is performed for crystal recovery (use of an RTA apparatus (Ag Associates AG4100) in Micro System Integration Center, Tohoku University, atmosphere replacement: $N_2$, temperature: 1,000° C., time: 30 sec).

FIGS. 18G and H An $SiO_2$ spacer (150 nm) is formed by TEOSCVD (g), and an $HfO_2$ layer (100 nm) is formed by EB evaporation (h).

FIG. 18I In the case of provision of a buffer layer, an $SiO_2$ layer (50 nm) is formed.

FIG. 18J The $SiO_2$ and $HfO_2$ layers are etched for formation of contact holes. The contact holes have a size of 990 μm×990 μm at an $n^+$-Si portion and a size of 20 μm×20 μm at a p-Si portion. The $HfO_2$ layer is etched by FAB, and the $SiO_2$ spacer is wet-etched with BHF (buffered hydrogen fluoride).

FIG. 18K An Al-Si (1%) layer (400 nm) which is to become electrodes and wiring, is formed by sputtering, followed by wet etching for patterning.

FIG. 18L An Al layer (30 nm) is formed by sputtering, and grooves of a nanodot array structure are patterned by electron beam (EB) lithography, followed by etching with FAB (under the same conditions as those used for production on the quartz substrate).

FIGS. 18M and 18N An $SiO_2$ protective film (50 nm) is formed by sputtering (m), and the $SiO_2$ protective film is etched in regions corresponding to electrode pads (n).

(3) Results of production

Figure 21A:
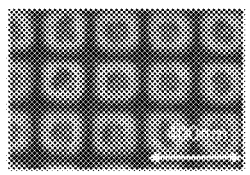
FIGS. 21A-21Y show examples of photographs of produced devices (FF=0.8)
Figure 21B:
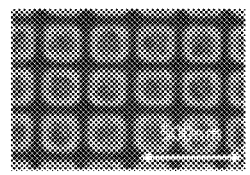
Figure 21C:
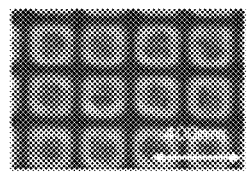
Figure 21D:
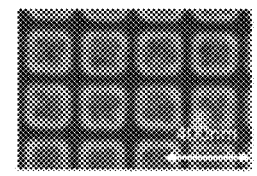
Figure 21E:
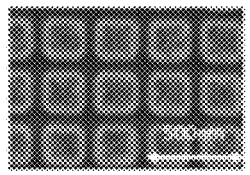
Figure 21F:
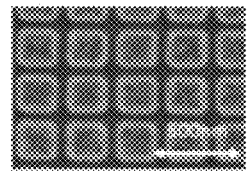
Figure 21G:
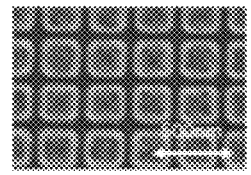
Figure 21H:
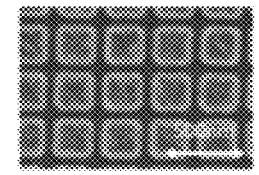
Figure 21I:
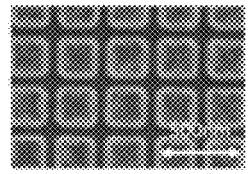
Figure 21J:
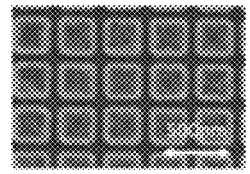
Figure 21K:
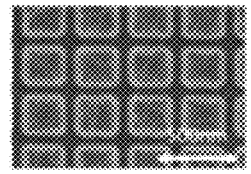
Figure 21L:
Figure 21M:
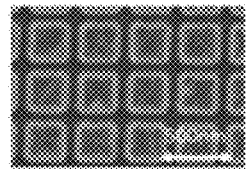
Figure 21N:
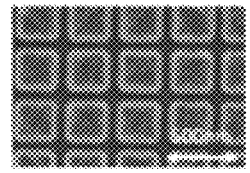
Figure 21O:
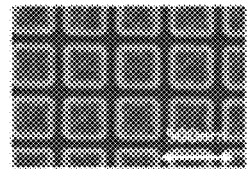
Figure 21P:
Figure 21Q:
Figure 21R:
Figure 21S:
Figure 21T:
Figure 21U:
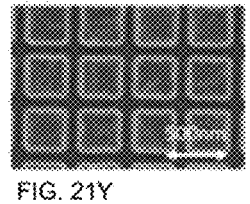
Figure 21V:
Figure 21W:
Figure 21X:
Figure 21Y:

FIG. 19 shows a photograph of an array portion (5×5) of the produced device. The produced filters are 25 patterns having an FF (=α/Λ) of 0.8 and a structural period of 220 to 460 nm (in increments of 10 nm). The filters correspond to (a) to (y) in FIG. 19. For comparison of FF, filters wherein FF=0.75 and 0.85 were produced. FIGS. 20A and 20B show photographs of the respective array portions (3×3). The filters are eight patterns having a structural period of 250 to 425 nm (in increments of 25 nm). The filters correspond to (1) to (8) and (1') to (8') in FIGS. 20A and 20B. One pattern of each array portion ((9) or (9')) does not have a filter. The SEM images of these filters are shown in FIGS. 21A-21Y, 22(1)-22(8), and 23 (1')-23(8'). As shown in these figures, the structures are precisely produced, and different types of reflected light are obtained in accordance with structural periods.

(4) I-V Characteristics of Photodiode

The I-V characteristics (I-V curve) of the produced photodiode were measured by means of a semiconductor parameter analyzer. The I-V characteristics were measured before formation of filters. FIG. 24 shows the thus-measured typical I-V characteristics. The photocurrent observed for all the photodiodes of different patterns showed that the I-V curve shifts in a negative direction upon incidence of light. As shown in FIG. 24, when the applied voltage is near 0 V, current hardly flows. However, spectral sensitivity characteristics can be determined through measurement of current flowing upon application of a reverse bias.

(5) Measurement of Wavelength Sensitivity Characteristics (FF=0.8)

Light having a wavelength of 400 to 700 nm (in increments of 10 nm) is caused to be incident on the device by means of a monochrometer (SG-100) available from Koken Kogyo, and I-V characteristics at each wavelength are recorded by means of a semiconductor parameter analyzer. FIG. 25 shows spectral sensitivity characteristics determined from current values obtained through application of a reverse bias voltage of −4 V. As shown in FIG. 25, transmission peaks are controlled by adjustment of structural periods.

In order to obtain data over a wider range, spectral sensitivity characteristics were measured by means of a spectrometer (CEP-25BXS wide range spectral sensitivity measuring apparatus) (measurement wavelength range: 300 to 1,200 nm, measurement resolution: 10 nm). FIG. 26 shows the thus-measured wavelength sensitivity characteristics. For comparison, FIG. 26 also shows the wavelength sensitivity characteristics of a photodiode having no filter. As shown in FIG. 26, the sensitivity at the transmission peak is up to about 70% relative to the sensitivity without filter. FIG. 27 shows comparison between the determined peak positions and calculated values. The difference between the measured and calculated peak positions was 50 nm or less; i.e., the wavelength sensitivity of the device was precisely controlled.

(6) Measurement of Wavelength Sensitivity Characteristics (FF=0.75, 0.85)

The control of FF is in a trade-off relationship with the transmittance at the transmission peak and that at a position other than the transmission peak. Thus, FF must be appropriately determined. As described above, the optimal FF is 0.75 to 0.85 where the ratio of the transmittance at the transmission peak to that at a position other than the transmission peak becomes maximum. For comparison of these values, the wavelength sensitivity characteristics of a photodiode array wherein FF was 0.75 or 0.85 were measured. FIGS. 28 and 29 show the wavelength sensitivity characteristics of the photodiode arrays wherein FF=0.75 and FF=0.85, respectively. FIG. 30 shows comparison between wavelength sensitivity characteristics of photodiodes having different FF values (Λ=350 nm). As shown in this comparison, the photodiode array whose FF value is 0.75 has higher sensitivity over the entire range of wavelength. However, the bandwidth of the transmission peak becomes narrower when the photodiode array whose FF value is 0.85 is used. The results are similar to the calculation results, and demonstrated the significance of design.

(7) Spectral characteristics (i) Principle of reconstitution of spectral characteristics of incident light The output signal from each optical sensor is the integrated quantity of energy spectra received by each photodiode, and the output signal cannot be divided into spectral components. Thus, the calculation between output signals is required for reconstructing the spectral characteristics of incident light from the output signals. In order to solve the inverse problem for determining the input signals (spectra of incident light) from the output signals, spectral characteristics are calculated by using the Tikhonov regularization method (Parameter Estimation and Inverse Problems, Elsevier Academic (2005), Keisan Rikigaku to CAE Shirizu 10: Gyakumondai "Computational Dynamics and CAE Series 10: Inverse Problem" (Baifukan (1992)).

Now will be considered a spectroscopic device composed of n optical sensors. The photocurrent of each optical sensor is obtained by integrating, with respect to the wavelength, the product of the spectral characteristics of incident light and the wavelength sensitivity characteristics of the optical sensor. The photocurrent is represented by the following formula (determinant) (1):

[F1]

$$O = SI \quad (1)$$

(wherein O is a 1×n column vector corresponding to the photocurrents [A] of the optical sensors; S is an n×m matrix corresponding to the wavelength sensitivity characteristics [A/W] of the optical sensors; "I" is a 1×m column vector corresponding to the spectral characteristics [W] of incident light; and m is a wavelength division number). "I" will now be determined by experimentally measuring O and S. In order to solve this inverse problem, "I" is calculated on the basis of the relation of the following formula (2) by use of a matrix M obtained by the Tikhonov regularization method:

[F2]

$$I = MO \quad (2)$$

(wherein M is an m×n matrix). Since the spectral characteristics cannot be a negative value, the condition of the following formula (3) is added.

[F3]

$$I = I(I>0) \text{ or } 0(I\leq 0) \quad (3)$$

The spectral characteristics are calculated by solving formulae (2) and (3).

(ii) Evaluation of Spectral Characteristics of Incident Light

The wavelength sensitivity characteristics of the produced device were determined as described above. Thus, theoretically, the spectral characteristics of light incident on the device can be evaluated. The wavelength sensitivity characteristics used for this evaluation are those of 25 patterns (FF=0.8) (wavelength: 400 to 700 nm; i.e., visible light region). In this experiment, monochromatic light (450, 500, 550, 600, or 650 nm) is caused to be incident on the device by means of a monochromatic light source (SG-100, available from Koken Kogyo), and incident spectra are reconstituted by the Tikhonov regularization method from the current of each pixel obtained in the device, to thereby determine the spectral characteristics. FIG. 31 shows the thus-determined spectral characteristics of incident light. For comparison, spectral characteristics measured with a commercially available spectroscope (Ocean optics) are shown by dotted lines. The positions of spectrum peaks determined by the Tikhonov regularization method were well consistent with the positions of spectrum peaks obtained by the commercially available spectroscope. The results were as expected. However, the accuracy of calculation is low in a blue light region. This is probably attributed to the fact that the device has low wavelength sensitivity in the blue light region and low accuracy of filter.

FIG. 32 is a top view of an exemplary metal grating layer used in the device produced by the aforementioned method in the present invention. The metal grating layer of the plasmonic color filter has a top surface structure formed of a two-dimensional periodic dot array. The two-dimensional periodic array is, for example, a square array or a three-fold rotationally symmetrical array (honeycomb structure). Each dot is in, for example, a square shape, or may be in a circular or triangular shape. An inverted dot array (i.e., a structure wherein square, circular, or triangular holes are periodically provided in a metal thin film) may be used.

Figure 33A:
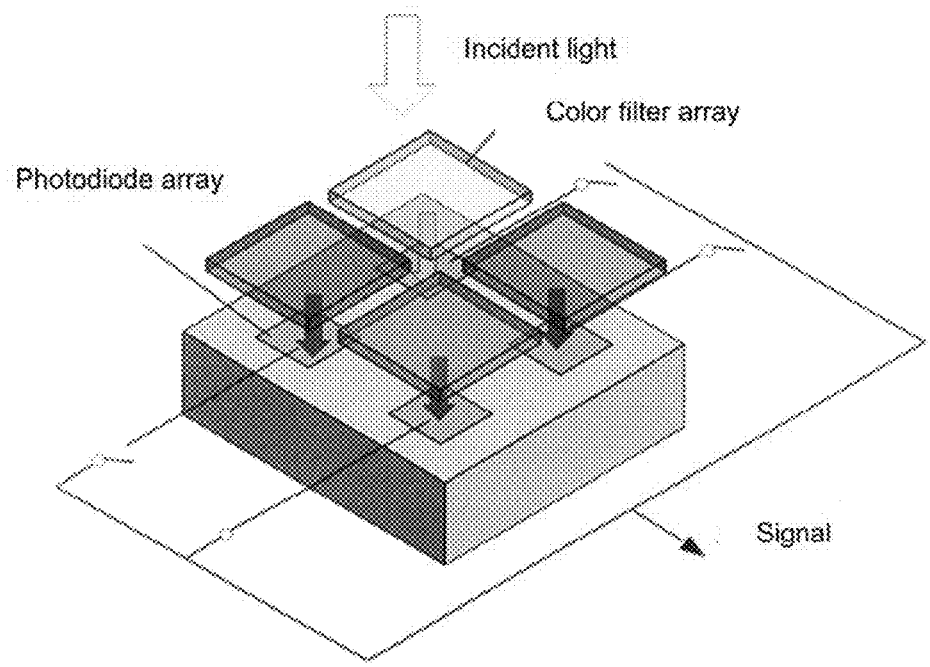
Figure 33B:
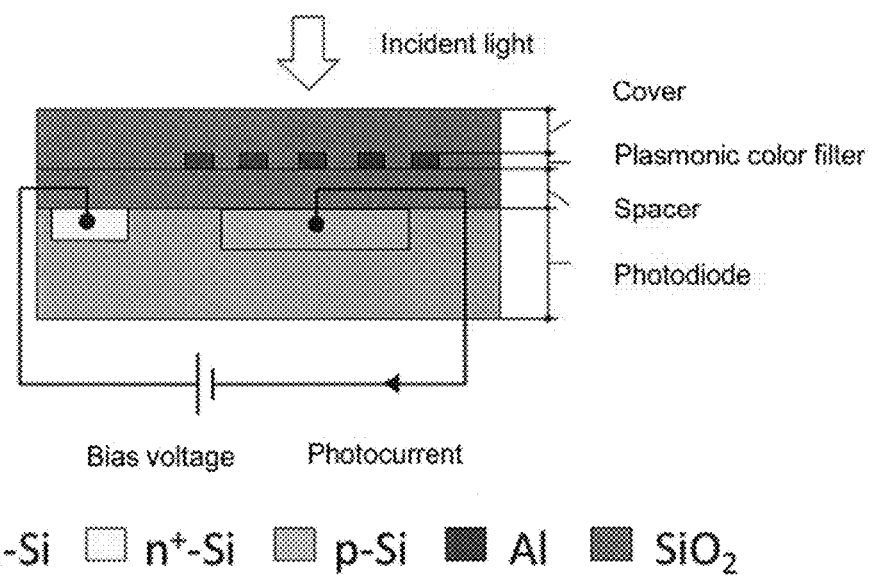

FIG. 33A shows an example of the concept of a spectroscopic device, indicating the relationship between each transmission GMRG array and a photodetector array. As shown in FIG. 33A, a plurality of optical sensors having different spectral sensitivity characteristics are disposed in which transmission GMRG structures having different spectroscopic characteristics are formed on photodiodes (2×2). Incident light is separated into its spectral components by the color filters and then incident on the photodiodes. The spectroscopic characteristics of the incident light are calculated by computational processing of sequentially read output signals from the photodiodes. FIG. 33B is a cross-sectional view of one transmission GMRG structure formed on one photodiode (i.e., a single optical sensor). The transmission GMRG structure is formed on the Si photodiode via a spacer.

(8) Summary

The spectroscopic device was produced by integration of the Si photodiode array and the GMRG. The wavelength sensitivity characteristics (peak position) of the device were precisely consistent with designed values, and spectral separation by the GMRG was determined. Monochromatic light was caused to be incident on the device, and the output signals obtained from the device were used for experimental calculation of the incident light. The calculated peak position of the incident light accurately coincides with the actual peak position.

The spectroscopic characteristics of the aforementioned device were nearly consistent with the designed values obtained by the RCWA method. The results demonstrated the significance of design for integration of a filter array and a photodiode array. It was also demonstrated that an improvement in filter accuracy leads to an improvement in calculation accuracy of spectroscopic characteristics.

Although the embodiments of the transmission guided-mode resonant grating integrated spectroscopic device of the present invention and the production method therefor have been described with reference to the drawings, the present invention is not limited to the aforementioned embodiments.

As described above, the transmission guided-mode resonant grating integrated spectroscopic device (transmission GMRG integrated spectroscopic device) is produced by the method shown in FIGS. 18A-18N; i.e., a method involving stacking of a transparent spacer layer (SiO$_2$ layer), an HfO$_2$ waveguide layer, an optional transparent buffer layer, a transmission metal (Al) grating layer having a thickness required for generation of surface plasmons, and an optional transparent protective film in this order on a photodetector array including a plurality of diodes disposed on a semiconductor substrate (i.e., a photodiode array including a plurality of diodes disposed on a silicon substrate). Alternatively, the transmission guided-mode resonant grating integrated spectroscopic device may be produced by a method involving formation of a photodetector array; separate formation of a transmission guided-mode resonant grating structure by stacking a waveguide layer, an optional transparent buffer layer, a transmission metal (Al) grating layer, and an optional transparent protective layer in this order on a transparent substrate serving as a transparent spacer layer (SiO$_2$ layer); and bonding of the photodetector array to the transparent spacer layer of the transmission guided-mode resonant grating structure.

In the production method for the transmission guided-mode resonant grating integrated spectroscopic device (transmission GMRG integrated spectroscopic device), a grating pattern of the metal grating layer (GMRG) or a mask therefor can be formed by means of nanoimprinting lithography, stepper (reduced size projection type exposure apparatus) lithography, or electron beam lithography.

In the production method for the transmission GMRG integrated spectroscopic device, the substrate, the waveguide layer, or the transparent SiO$_2$ layer can be etched by means of any technique other than the FAB described in the embodiments, such as ion milling, reactive ion etching, or wet etching.

No particular limitation is imposed on the material of the waveguide layer, so long as the material has a refractive index higher than that of each of the transparent layers provided above and below the waveguide layer. Examples of the material include, besides HfO$_2$ described in the embodiments, Al$_2$O$_3$, MgO, ZrO$_2$, Ta$_2$O$_5$, TiO$_2$, silicon nitride (Si$_3$N$_4$ and SiN), silicon oxynitride (SiON), silicon carbide (SiC), gallium nitride (GaN), and a polymer of high refractive index. Examples of the polymer of high refractive index include polymers having a refractive index of higher than 1.5, and known polymers of high refractive index represented by a chemical formula having a sulfur-containing substituent (e.g., thioether, sulfone, thiophene, thiadiazole, or thianthrene).

No particular limitation is imposed on the material of each of the layers (thicknesses t$_3$ and t$_b$) which sandwich the waveguide layer, so long as the material is transparent and has a refractive index lower than that of the waveguide layer. Examples of the material include, besides SiO$_2$ described in the embodiments, MgF$_2$, silicon nitride (Si$_3$N$_4$ and SiN), silicon oxynitride (SiON), silicon carbide (SiC), gallium nitride (GaN), polymers (e.g., PMMA (polymethyl methacrylate)), photoresist, EB (electron beam) resist, polyethylene, polypropylene, cycloolefin, and PDMS (polydimethylsiloxane).

Examples of the metal used in the transmission metal grating layer include gold, silver, aluminum, and copper. Of these, silver and aluminum are preferred. In view of production cost, aluminum is particularly preferred.

The material (substrate) forming the photodetector is not limited to the silicon material targeted for visible light described in the embodiments. There may be used a photodiode for another wavelength range (e.g., ultraviolet, near-infrared, or infrared), a thermocouple, a thermopile, a bolometer, a thermistor, a pyroelectric element, a capacitor microphone-type pneumatic detector, or a Golay cell-type pneumatic detector. Specific examples of the material include Ge, InGaAs, PbS (lead sulfide), InAs, InAsSb, InSb, GaN, GaAs, AlGaAs, GaAsP, GaP, InP, GaSb, CIS (a compound semiconductor composed of copper, indium, and selenium), CIGS (a compound semiconductor composed of copper, indium, gallium, and selenium), HgCdTe, and PbSe.

The material of the substrate is preferably selected from among silicon (Si), Ge, InGaAs, GaN, GaAs, AlGaAs, GaAsP, GaP, CIS (a compound semiconductor composed of copper, indium, and selenium), and CIGS (a compound semiconductor composed of copper, indium, gallium, and selenium).

The material of the electrodes and wiring for the photodiode may be, instead of Al—Si described in the embodiments, any material through which current flows, such as gold, silver, copper, aluminum, or highly doped silicon.

The transmission GMRG integrated spectroscopic device of the present invention has been described above. The novel transmission guided-mode resonant grating structure, which is formed on the photodetector array, can be used as, for example, a color filter for various applications. That is, the present invention also encompasses the transmission guided-mode resonant grating structure (transmission GMRG structure), which includes a transparent substrate, a waveguide layer, an optionally provided transparent buffer layer, a transmission metal grating layer having a thickness required for generation of surface plasmons, and an optionally provided transparent protective film in this order.

DESCRIPTION OF REFERENCE NUMERALS

1: Photodetector array (silicon wafer)
2: $HfO_2$ waveguide layer
3: Photofilter layer
4: $SiO_2$ spacer layer
5: Buffer layer
6: $SiO_2$ protective film

The invention claimed is:

1. A transmission guided-mode resonant grating integrated spectroscopic device (transmission GMRG integrated spectroscopic device) characterized by comprising a photodetector array including a semiconductor substrate and a plurality of diodes disposed on the substrate; and a transparent spacer layer, a waveguide layer, and a transmission metal grating layer having a thickness required for generation of surface plasmons, the said layers being disposed in this order on the photodetector array,
wherein the transparent spacer layer is directly provided on the photodetector array, and the transmission metal grating layer consists of a metal.

2. The transmission GMRG integrated spectroscopic device according to claim 1, wherein the material of the waveguide layer is selected from among hafnium oxide ($HfO_2$), aluminum oxide ($Al_2O_3$), magnesium oxide (MgO), zirconium oxide ($ZrO_2$), tantalum oxide ($Ta_2O_5$), titanium oxide ($TiO_2$) silicon nitride ($Si_3N_4$ and SiN), silicon oxynitride (SiON), silicon carbide (SiC), gallium nitride (GaN), and a polymer having a high refractive index.

3. The transmission GMRG integrated spectroscopic device according to claim 1, wherein the material of the substrate is selected from among silicon (Si), Ge, InGaAs, GaN, GaAs, AlGaAs, GaAsP, GaP, CIS (a compound semiconductor composed of copper, indium, and selenium), and CIGS (a compound semiconductor composed of copper, indium, gallium, and selenium).

4. The transmission GMRG integrated spectroscopic device according to claim 1, wherein the metal of the transmission metal grating layer is selected from among gold, silver, aluminum, and copper.

5. The transmission GMRG integrated spectroscopic device according to claim 1, wherein the metal of the transmission metal grating layer is aluminum (Al), the transmission metal grating layer has a grating structural period Λ of 100 to 560 nm and a fill factor (FF) of 0.4 to 0.95 where FF is the ratio of the length α of one side of each Al dot to Λ.

6. A product comprising a transmission guided-mode resonant grating integrated spectroscopic device (transmission GMRG integrated spectroscopic device) as recited in claim 1.

7. A method for producing a transmission guided-mode resonant grating integrated spectroscopic device (transmission GMRG integrated spectroscopic device) as recited in claim 1, the method being characterized by comprising forming the photodetector array; and directly stacking, on the substrate, the transparent spacer layer, the waveguide layer, and the transmission metal grating layer in this order.

8. A method for producing a transmission GMRG integrated spectroscopic device according to claim 7, wherein the method comprises a step of forming a grating pattern of the transmission metal grating layer (GMRG) or a mask therefor by means of nanoimprinting lithography, stepper lithography, or electron beam lithography.

9. A method for producing a transmission guided-mode resonant grating integrated spectroscopic device (transmission GMRG integrated spectroscopic device) as recited in claim 1, the method being characterized by comprising forming the photodetector array; forming a transmission guided-mode resonant grating structure by stacking the waveguide layer, and the transmission metal grating layer in this order on a transparent substrate serving as the transparent spacer layer; and bonding the photodetector array to the transparent spacer layer of the transmission guided-mode resonant grating structure.

10. A method for producing a transmission GMRG integrated spectroscopic device according to claim 9, wherein the method comprises a step of forming a grating pattern of the transmission metal grating layer (GMRG) or a mask therefor by means of nanoimprinting lithography, stepper lithography, or electron beam lithography.

11. The transmission GMRG integrated spectroscopic device according to claim 1, comprising a transparent buffer layer between the waveguide layer and the transmission metal grating layer.

12. The transmission GMRG integrated spectroscopic device according to claim 11, wherein the waveguide layer has a refractive index higher than that of each of the transparent spacer layer and the transparent buffer layer, which sandwich the waveguide layer.

13. The transmission GMRG integrated spectroscopic device according to claim 11, wherein the substrate is a silicon substrate, the transparent spacer layer is an $SiO_2$ layer, the waveguide layer is a hafnium oxide ($HfO_2$) layer, and the transparent buffer layer is an $SiO_2$ layer.

14. The transmission GMRG integrated spectroscopic device according to claim 11, wherein the transparent buffer layer is an $SiO_2$ layer and has a thickness ($t_b$) of 0 to 300 nm.

15. The transmission GMRG integrated spectroscopic device according to claim 1, comprising a transparent protective layer on the transmission metal grating layer.

* * * * *